US008633774B2

(12) United States Patent
Wood

(10) Patent No.: US 8,633,774 B2
(45) Date of Patent: Jan. 21, 2014

(54) ELECTRONIC PULSE GENERATOR AND OSCILLATOR

(75) Inventor: John Wood, Northamptonshire (GB)

(73) Assignee: Analog Devices, Inc., Norwood, MA (US)

( * ) Notice: Subject to any disclaimer, the term of this patent is extended or adjusted under 35 U.S.C. 154(b) by 106 days.

(21) Appl. No.: 13/311,339

(22) Filed: Dec. 5, 2011

(65) Prior Publication Data

US 2012/0133445 A1 May 31, 2012

Related U.S. Application Data

(63) Continuation of application No. 11/863,217, filed on Sep. 27, 2007, now Pat. No. 8,081,035, which is a continuation of application No. 11/672,928, filed on Feb. 8, 2007, now abandoned, which is a continuation of application No. 10/275,461, filed as application No. PCT/GB01/02069 on May 11, 2001, now Pat. No. 7,236,060.

(30) Foreign Application Priority Data

| May 11, 2000 | (GB) | .................... | 0011243.3 |
| Oct. 6, 2000 | (GB) | .................... | 0024522.5 |
| Feb. 3, 2001 | (GB) | .................... | 0102700.2 |

(51) Int. Cl.
*H03B 5/18* (2006.01)

(52) U.S. Cl.
USPC ............... 331/96; 331/107 SL; 331/107 DP; 331/57; 327/292; 327/293

(58) Field of Classification Search
USPC .......... 331/57, 107 SL, 107 DP, 96; 327/292, 327/293
See application file for complete search history.

(56) References Cited

U.S. PATENT DOCUMENTS

| 3,516,021 | A | 6/1970 | Kohn |
| 3,538,450 | A | 11/1970 | Andrea et al. |
| 4,246,550 | A | 1/1981 | Cohen |
| 4,514,707 | A | 4/1985 | Dydyk et al. |
| 4,686,407 | A | 8/1987 | Ceperley |
| 4,749,963 | A | 6/1988 | Makimoto et al. |
| 4,875,046 | A | 10/1989 | Lewyn |

(Continued)

FOREIGN PATENT DOCUMENTS

| DE | 43 22 701 | 8/1994 |
| EP | 0 478 134 | 4/1992 |

(Continued)

OTHER PUBLICATIONS

International Search Report for PCT Appl No. PCT/GB2001/02069, dated Jul. 9, 2001.

(Continued)

*Primary Examiner* — Arnold Kinkead

(74) *Attorney, Agent, or Firm* — Knobbe Martens Oslon & Bear LLP

(57) ABSTRACT

Improvements in and relating to electronic pulse generation or oscillation circuitry based on a signal path exhibiting endless electromagnetic continuity and affording signal phase inversion in setting pulse duration or half-cycles of oscillation within time of signal traverse of said signal path, and having active switching means associated with said signal path to set rise and fall times of each said pulse or said half-cycle of oscillation, including for frequency adjustment by selective inductance and power saving without stopping pulse generation or oscillation.

20 Claims, 31 Drawing Sheets

(56) References Cited

U.S. PATENT DOCUMENTS

| | | |
|---|---|---|
| 5,117,206 A | 5/1992 | Imamura |
| 5,235,335 A | 8/1993 | Hester et al. |
| 5,302,920 A | 4/1994 | Bitting |
| 5,361,277 A | 11/1994 | Grover |
| 5,493,715 A | 2/1996 | Humphreys et al. |
| 5,584,067 A | 12/1996 | Buer et al. |
| 5,592,126 A | 1/1997 | Boudewijns et al. |
| 5,640,112 A | 6/1997 | Goto et al. |
| 5,652,549 A | 7/1997 | Unterricker et al. |
| 5,677,599 A | 10/1997 | Wood |
| 5,754,833 A | 5/1998 | Singh et al. |
| 5,825,211 A | 10/1998 | Smith et al. |
| 5,945,847 A | 8/1999 | Ransijn |
| 5,963,086 A | 10/1999 | Hall |
| 5,973,633 A | 10/1999 | Hester |
| 6,002,274 A | 12/1999 | Smith et al. |
| 6,078,202 A | 6/2000 | Tomatsuri et al. |
| 6,133,798 A | 10/2000 | Nagano et al. |
| 6,150,886 A | 11/2000 | Shimomura |
| 6,157,037 A | 12/2000 | Danielson |
| 6,239,663 B1 | 5/2001 | Mizutani |
| 6,259,327 B1 | 7/2001 | Balistreri et al. |
| 6,259,747 B1 | 7/2001 | Gustafsson et al. |
| 6,281,759 B1 | 8/2001 | Coffey |
| 6,323,737 B1 | 11/2001 | Broekaert |
| 6,396,359 B1 | 5/2002 | Hajimiri et al. |
| 6,426,662 B1 | 7/2002 | Arcus |
| 6,525,618 B2 | 2/2003 | Wood |
| 6,556,089 B2 | 4/2003 | Wood |
| 6,566,968 B2 | 5/2003 | Aghahi |
| 6,683,503 B2 | 1/2004 | Mizuno et al. |
| 6,781,424 B2 | 8/2004 | Lee et al. |
| 6,856,208 B2 | 2/2005 | Lee et al. |
| 6,870,431 B2 | 3/2005 | Afghahi |
| 6,900,699 B1 | 5/2005 | Kim |
| 6,943,599 B2 | 9/2005 | Ngo |
| 6,995,620 B2 | 2/2006 | Afghahi |
| 7,005,930 B1 | 2/2006 | Kim et al. |
| 7,085,668 B2 | 8/2006 | Johnson |
| 7,088,154 B2 | 8/2006 | Ngo |
| 7,091,802 B2 | 8/2006 | Ham et al. |
| 7,130,604 B1 | 10/2006 | Wong et al. |
| 7,218,180 B2 | 5/2007 | Wood |
| 7,224,199 B1 | 5/2007 | Kang |
| 7,224,235 B2 | 5/2007 | De Ranter et al. |
| 7,236,060 B2 | 6/2007 | Wood |
| 7,242,272 B2 | 7/2007 | Ham et al. |
| 7,274,262 B2 | 9/2007 | Ham et al. |
| 7,295,076 B2 | 11/2007 | Kim et al. |
| 7,307,483 B2 | 12/2007 | Tzartzanis et al. |
| 7,315,219 B2 | 1/2008 | Chiang |
| 7,339,439 B2 | 3/2008 | Roubadia et al. |
| 7,378,893 B1 | 5/2008 | Kang |
| 7,397,230 B2 | 7/2008 | Tabaian et al. |
| 7,409,012 B2 | 8/2008 | Martin et al. |
| 7,446,578 B2 | 11/2008 | Huang |
| 7,471,153 B2 | 12/2008 | Kee et al. |
| 7,482,884 B2 | 1/2009 | Wang et al. |
| 7,504,895 B2 | 3/2009 | Neidorff |
| 7,511,588 B2 | 3/2009 | Gabara |
| 7,513,873 B2 | 4/2009 | Shifrin |
| 7,515,005 B2 | 4/2009 | Dan |
| 7,541,794 B2 | 6/2009 | Tabaian et al. |
| 7,545,225 B2 | 6/2009 | Beccue |
| 7,551,038 B2 | 6/2009 | Jang et al. |
| 7,571,337 B1 | 8/2009 | Zhai et al. |
| 7,577,225 B2 | 8/2009 | Azadet et al. |
| 7,609,756 B2 | 10/2009 | Wood |
| 7,612,621 B2 | 11/2009 | Kim et al. |
| 7,616,070 B2 | 11/2009 | Tzartzanis et al. |
| 7,656,239 B2 | 2/2010 | Bietti et al. |
| 7,656,336 B2 | 2/2010 | Wood |
| 7,656,979 B2 | 2/2010 | Leydier et al. |
| 7,663,328 B2 | 2/2010 | Gonder |
| 7,715,143 B2 | 5/2010 | Bliss et al. |
| 7,741,921 B2 | 6/2010 | Ismailov |
| 7,782,988 B2 | 8/2010 | Ziesler |
| 7,833,158 B2 | 11/2010 | Bartz |
| 7,847,643 B2 | 12/2010 | Da Dalt |
| 7,885,625 B2 | 2/2011 | Muhammad et al. |
| 7,893,778 B2 | 2/2011 | Mohtashemi et al. |
| 7,907,023 B2 | 3/2011 | Liang et al. |
| 7,911,284 B2 | 3/2011 | Kuwano |
| 7,924,076 B2 | 4/2011 | Suzuki et al. |
| 7,936,193 B2 | 5/2011 | Van Der Wel et al. |
| 7,944,316 B2 | 5/2011 | Watanabe et al. |
| 7,952,439 B1 | 5/2011 | Heggemeier et al. |
| 7,973,609 B2 | 7/2011 | Ohara et al. |
| 7,995,364 B2 | 8/2011 | Shiu |
| 8,008,981 B2 | 8/2011 | Hong et al. |
| 8,049,563 B2 | 11/2011 | Aoki et al. |
| 2006/0208776 A1 | 9/2006 | Tonietto et al. |
| 2008/0074202 A1 | 3/2008 | Gabara |
| 2009/0322394 A1 | 12/2009 | Song et al. |
| 2010/0117744 A1 | 5/2010 | Takinami et al. |
| 2010/0156549 A1 | 6/2010 | Uemura et al. |
| 2010/0321121 A1 | 12/2010 | Mohtashemi |
| 2011/0095833 A1 | 4/2011 | Mohtashemi et al. |
| 2011/0156760 A1 | 6/2011 | Bhuiyan et al. |
| 2011/0156773 A1 | 6/2011 | Beccue |
| 2011/0195683 A1 | 8/2011 | Brekelmans et al. |
| 2011/0286510 A1 | 11/2011 | Levantino et al. |
| 2012/0008717 A1 | 1/2012 | van Sinderen et al. |
| 2012/0013363 A1 | 1/2012 | Takinami et al. |
| 2012/0013407 A1 | 1/2012 | Takinami et al. |
| 2012/0025918 A1 | 2/2012 | Wang et al. |

FOREIGN PATENT DOCUMENTS

| | | |
|---|---|---|
| EP | 0 583 839 | 2/1994 |
| EP | 0 633 662 | 11/1995 |
| EP | 0 696 843 | 2/1996 |
| EP | 0 891 045 | 1/1999 |
| GB | 1 247 199 | 9/1971 |
| WO | WO 95/12263 | 5/1995 |
| WO | WO 00/44093 | 7/2000 |

OTHER PUBLICATIONS

Hatsuhiro Kato: "*A Dynamic Formulation of Ring Oscillator as Solitary-Wave Propagator*," IEEE Transactions on Circuits and Systems-1: Fundamental Theory and Applications, vol. 45, No. 1, Jan. 1998, pp. 98-101, XP002168328.

Patent Abstracts of Japan, vol. 016, No. 465 (E-1270), Sep. 28, 1992 & JP 04 165809 A (NEC Corp), Jun. 11, 1992 abstract.

Patent Abstracts of Japan, vol. 010, No. 079 (E-391), Mar. 28, 1986, & JP 60 224205 A (Oki Denki Kogyo KK), Nov. 8, 1985 abstract.

Hiroyuki Yabuki et al.: "*Miniaturized Stripline Dual-Mode Ring Resonators and Their Application to Oscillating Devices*." IEEE MTT-s International Microwave Symposium Digest, US, New York, IEEE, May 16, 1995, pp. 1313-1316, XP000552959, ISBN: 0-7803-2582-6.

Hirofumi Nagashino et al.: "*Generation of Traveling Wave Mode in a Chained Neural Oscillator Network Model*," Proceedings of the International Conference on Neural Networks, (ICNN), US, New York, IEEE, vol. 3, Mar. 28, 1993, pp. 1550-1557, XP000379507, ISBN: 0-7803-0999-5.

Kim et al., "ISSCC 2000/Session 26/Analog Techniques/Paper WP 26.3," 2000, pp. 430-431 & 475, 2000 IEEE International Solid-State Circuits Conference.

Divina et al., "*The Distributed Oscillator at 4 GHz*," May 1998, pp. 1-4, IEEE.

Kleveland et al., "*MP 4.3 Monolithic CMOS Distributed Amplifier and Oscillator*," Feb. 1999, 9 pages, 1999 IEEE International Solid-State Circuits Conference.

Wu, H. et al., "*A 106GHz CMOS Distributed Voltage Controlled Oscillator*," Custom Integrated Circuits Conference, 2000. CICC. Proceedings of the IEEE 2000, May 2000, pp. 581-584.

Larsson, Hakan, "*Distributed Synchronous Clocking using Connected Ring Oscillators*," Jan. 1997, Centre for Computer Systems, Technical Report CCA -9705, pp. i-43.

(56) References Cited

OTHER PUBLICATIONS

Yabuki et al., "*Miniaturized Stripline Dual-Mode Ring Resonators and Their Application to Oscillating Devices,*" IEEE, May 1995, pp. 1313-1316.

Kleveland et al., "*50-GHZ Interconnect Design in Standard Silicon Technology,*" IEEE, Jun. 1998, pp. 1913-1916.

Savoj, Razavi, "*A 10 Gb/S CMOS Clock and Data Recovery Circuit with Frequency Detection,*" ISSCC 2001/Session 5, Feb. 2001.

Skvor, Saunders, "*Novel Decade Electronically Tunable Microwave Oscillator Based on the Distributed Amplifier,*" Electronics Letters, vol. 28, No. 17, Aug. 1992, pp. 1647-1648.

Dunning et al., "*An All-Digital Phase-Locked Loop with 50-Cycle Lock Time Suitable for High-Performance Microprocessors,*" IEEE Journal of Solid-State Circuits, vol. 30, No. 4, Apr. 1995, pp. 412-422.

Bussmann et al., "*Active Compensation of Interconnect Losses for Multi-GHz Clock Distribution Networks,*" IEEE Transactions on Circuits and Systems-II: Analog and Digital Signal Processing, vol. 39, No. 11, Nov. 1992, pp. 790-798.

Yue et al., "*On-Chip Spiral Inductors with Patterned Ground Shields for Si-Based RF IC's,*" IEEE Journal of Solid-State Circuits, vol. 33, No. 5, May 1998, pp. 743-752.

Kral et al., "*RF-CMOS Oscillators with Switched Tuning,*" IEEE 1998, Custom Integrated Circuits Conference, May 1998, pp. 555-558.

Hall et al., "*Clock Distribution Using Cooperative Ring Oscillators,*" 1997 IEEE, Sep. 1997, pp. 62-75.

Kleveland et al., "*Line Inductance Extraction and Modeling in a Real Chip with Power Grid,*" 1999 IEEE, Dec. 1999, pp. IEDM 99-901 to IEDM 99-904.

Reatti et al., "*Solid and Litz-Wire Winding Non-Linear Resistance Comparsion,*" Proc. 43rd IEEE Midwest Symp. on Circuits and Systems, Aug. 2000, pp. 466-469.

Lee, Razavi, "*A 40Gb/s Clock and Data Recovery Circuit in 0.18um CMOS Technology,*" IEEE ISSCC 2003, Session 13, Paper 13.7, Feb. 11, 2003.

Wood et al., "*25.5 Multi-Gigahertz Low-Power, Low-Skew, Rotary Clock Scheme,*" IEEE ISSCC2001. Session 25, Feb. 2001, Paper WO25.5.

Rotary Traveling-Wave Oscillator Arrays: A New Clock Technology, Wood et al. IEEE Journal of Solid State Circuits, vol. 36, No. 11, Nov. 2011.

"TWISTED PAIR"

STRAIGHT LO-PARALLEL

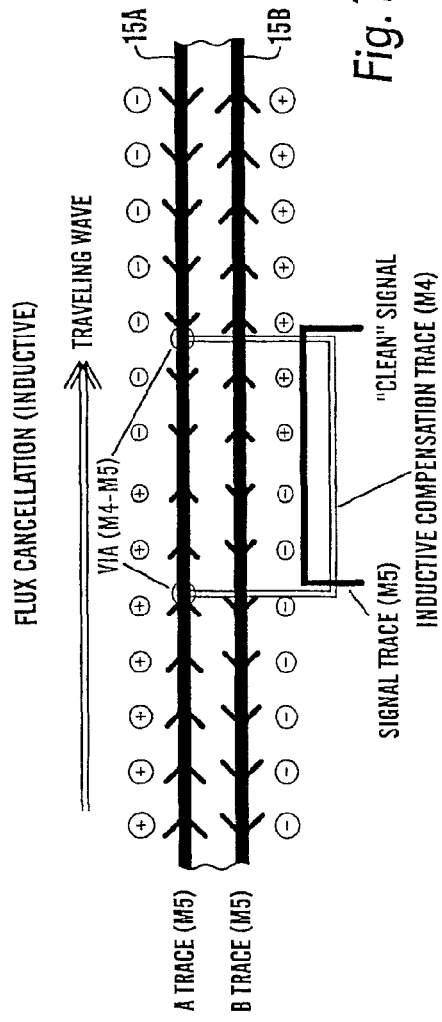
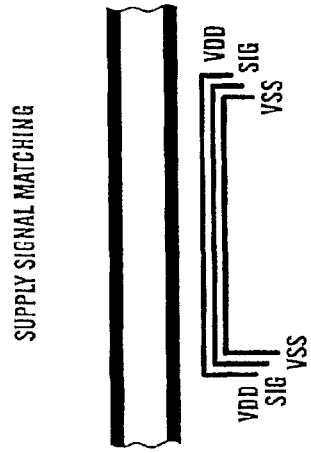
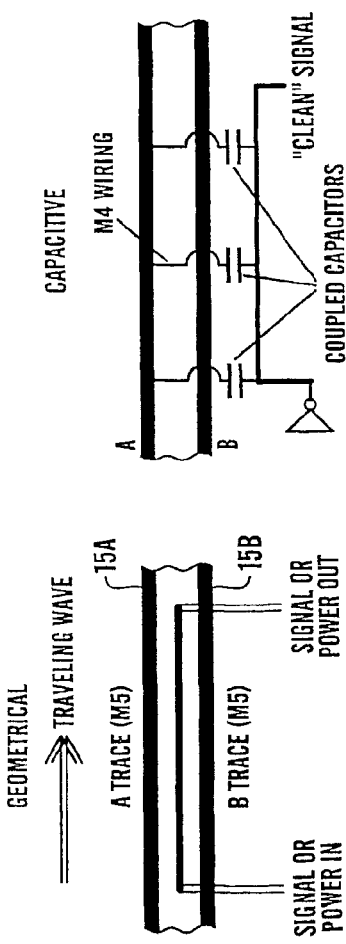
Fig. 11A
Fig. 11B
Fig. 11C
Fig. 11D

ROTATION DIRECTION START-UP AND POWER DOWN SYSTEM

DIGITAL SELECTION OF GRID COUPLING/POWERING

ABSORBING NON-PREFERED DIRECTION TO INDUCE START-UP FULL BRIDGE POSSIBLE

OPEN LOOP TRACE (MAGNETICALLY COUPLED TO A-B)

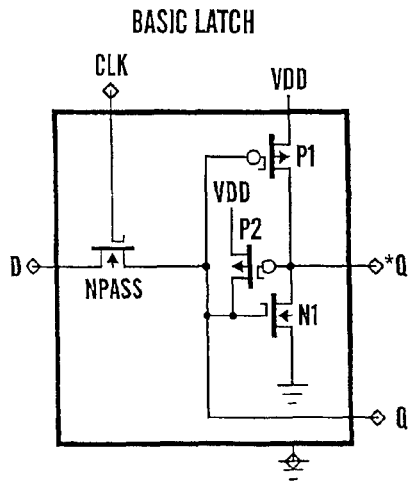
Fig. 14A — BASIC LATCH
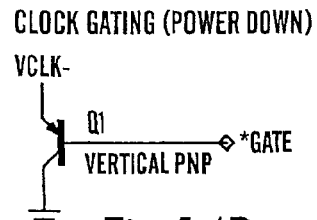
Fig. 14D — CLOCK GATING (POWER DOWN)
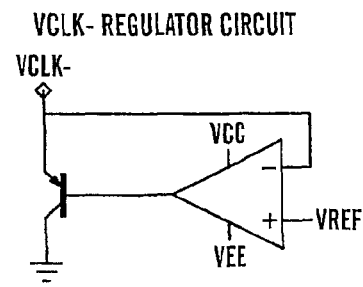
Fig. 14E — VCLK- REGULATOR CIRCUIT
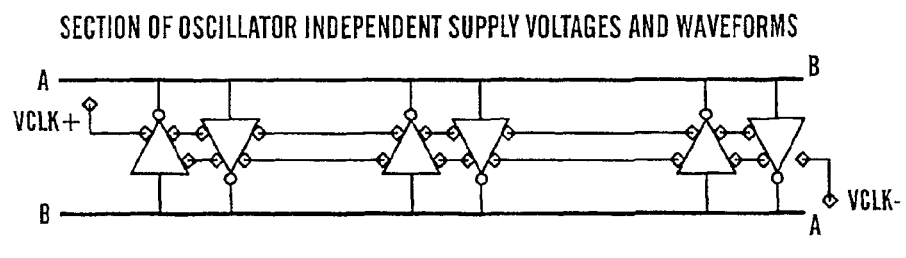
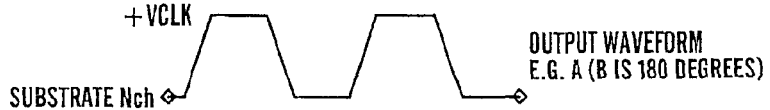
Fig. 14B — SECTION OF OSCILLATOR INDEPENDENT SUPPLY VOLTAGES AND WAVEFORMS
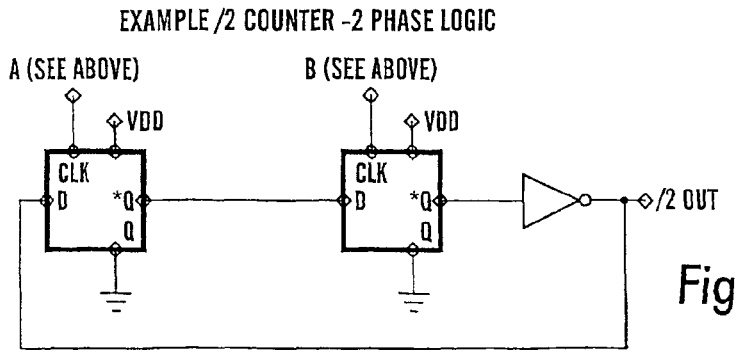
Fig. 14C — EXAMPLE /2 COUNTER -2 PHASE LOGIC NMOS ONLY BRIDGE CIRCUIT OPTION
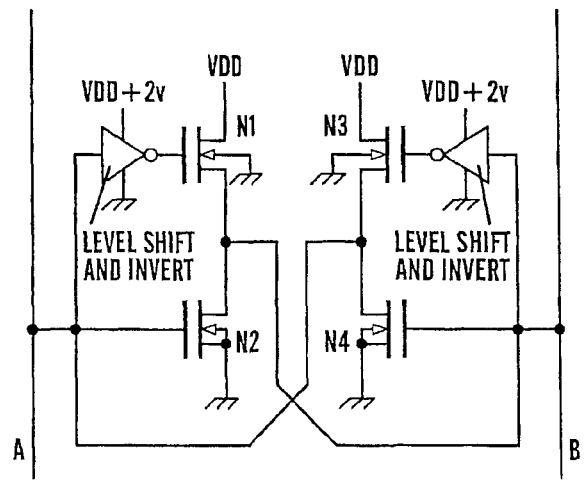
NOTES:
- LEVEL SHIFT CHARGE PUMP
  CIRCUIT NOT SHOWN
Fig. 15D
ADJUSTING LINE-LINE CAPACITANCE C_LINE_AB
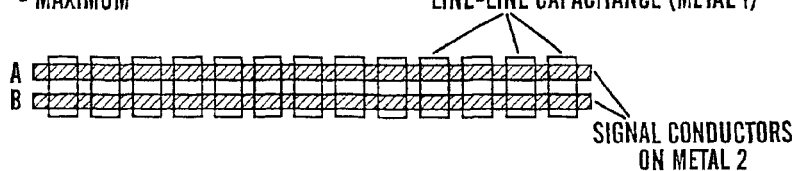
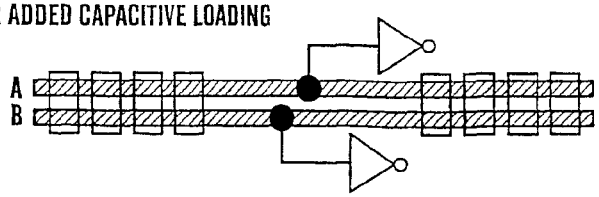
Fig. 15E PLANAR TRANSMISSION LINE TRANSFORMERS
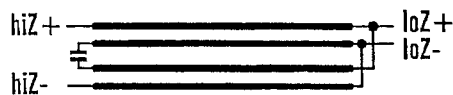
2:1 TRANSFOMER (4:1 IMPEDANCE)
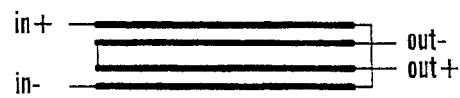
1:1 ISOLATING TRANSFORMER
Fig. 16C
USE OF TRANSMISSION-LINE TRANSFORMER FOR IMPEDANCE CONVERSION
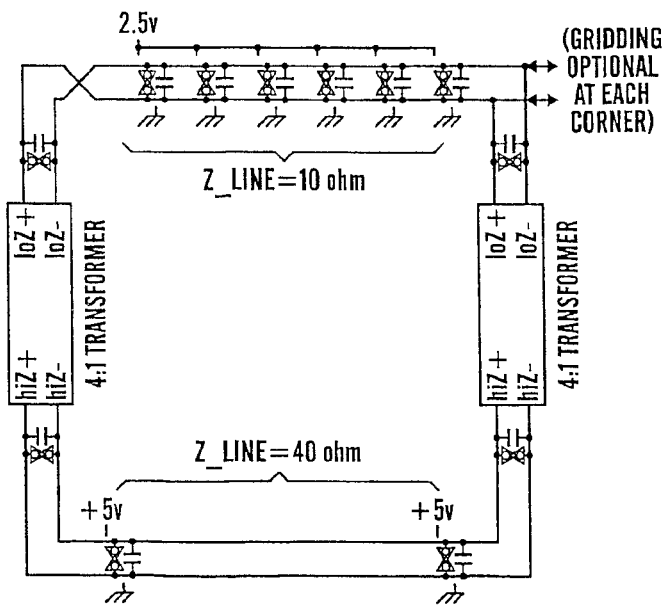
E.M. WAVES CIRCULATE CLOCKWISE OR ANTI-CLOCKWISE
Fig. 16D

MULTILAYER LITZ 'WEAVE'

FAST DIFFERENTIAL LINE (NON-COPLANAR)

LOW LOSS, LOW INDUCTANCE POWER SUPPLY DISTRIBUTION TRACES

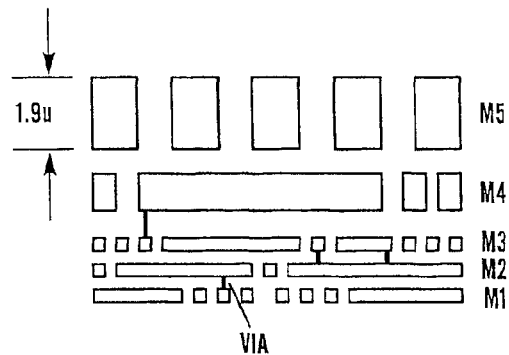
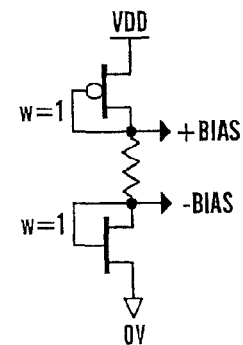
Fig.19A    Fig.19B
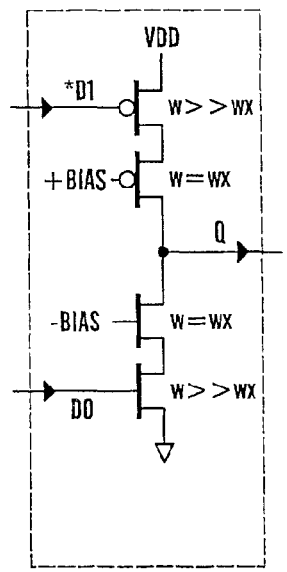
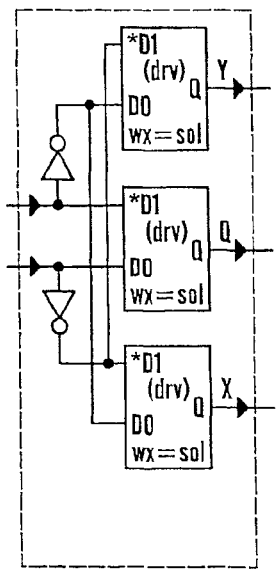
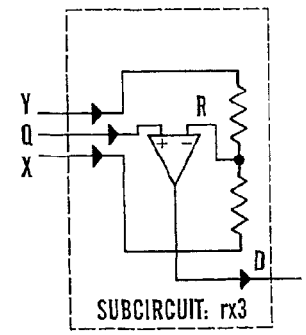
Fig.19C    Fig.19D    Fig.19E

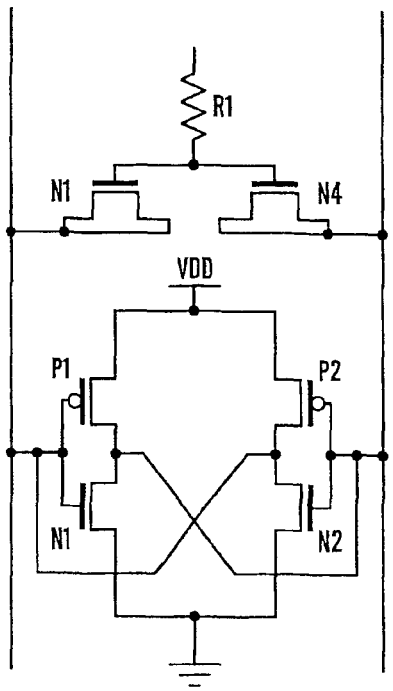
*Fig.20A*
(1) COMPENSATION PRINCIPLE
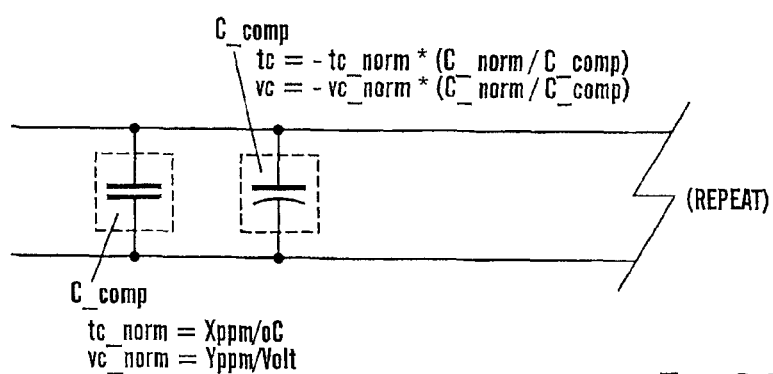
$tc = -tc\_norm * (C\_norm / C\_comp)$
$vc = -vc\_norm * (C\_norm / C\_comp)$
$tc\_norm = Xppm/oC$
$vc\_norm = Yppm/Volt$
(2) EXAMPLE C_COMP STRUCTURE
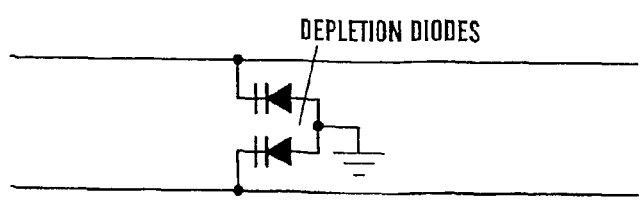
*Fig.20B*

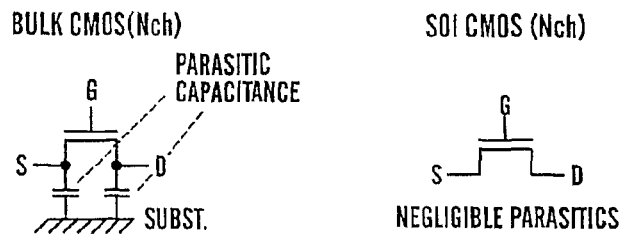
Fig.22A
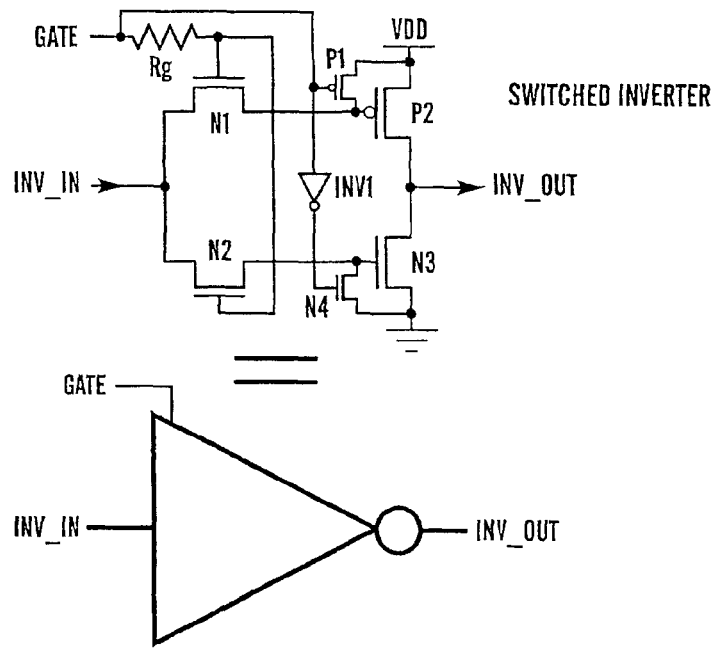
Fig.22B
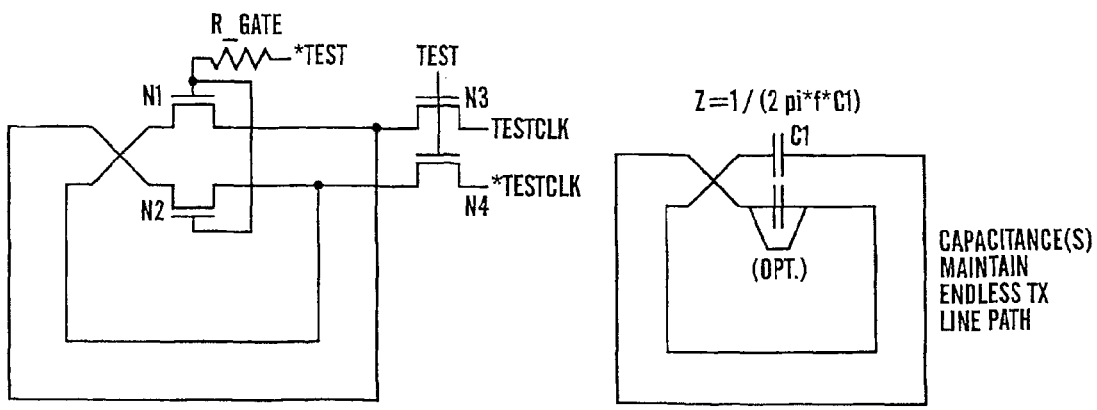
Fig.22C
Fig.22D

CROSSOVERS

LOW DIFF
INDUCTANCE

MUTUAL L ADDS

PLANAR COILS  HIGH L,Z
CAPACITIVE COUPLING

HIGH DIFF L
OR ↷
AND ↶
WINDINGS

ELECTRONIC PULSE GENERATOR AND OSCILLATOR

CROSS REFERENCE TO RELATED APPLICATIONS

This application is a continuation of U.S. application Ser. No. 11/863,217, filed Sep. 27, 2007, and titled "Electronic Pulse Generator and Oscillator", now U.S. Pat. No. 8,081, 035, issued Dec. 20, 2011, which is a continuation of U.S. patent application Ser. No. 11/672,928, filed Feb. 8, 2007, titled "ELECTRONIC PULSE GENERATOR AND OSCILLATOR," now abandoned, which is a continuation of U.S. patent application Ser. No. 10/275,461, filed Apr. 7, 2003, titled "ELECTRONIC PULSE GENERATOR AND OSCILLATOR," now U.S. Pat. No. 7,236,060, issued Jun. 26, 2007, which is a national stage application of PCT application, PCT/GB01/02069, publication number WO 01/89088, filed May 11, 2001, and this application and the PCT/GB01/02069 application claim priority to GB0011243.3, filed May 11, 2000, GB0024522.5, filed Oct. 6, 2000, and GB0102700.2, filed Feb. 3, 2001. The PCT/GB01/02069, GB0011243.3, GB0024522.5, and GB0102700.2 are incorporated by reference into the present application. U.S. Pat. No. 6,556,089 is incorporated by reference into the present application.

FIELD OF INVENTION

This invention concerns improvements in and relating to electronic production and use of repeating cyclic pulse signals having a repetition rate related to electrical signal path length(s).

BACKGROUND TO INVENTION

Co-pending international patent application PCT/GB00/00175 (published WO 00/44093) has the same inventor as this application, and relates to such electronic signal production. Suitable disclosed electronic circuitry includes composite electromagnetic/semiconductor structures for providing timing signals in integrated circuits (ICs), typically in clocking digital ICs, including VLSI (very large scale integrated) circuits. Uniquely such provisions have no physical distinction between signal operation means and signal distribution means, those functions now being merged in the same physical means.

Structurally, suitable such means includes at least one signal path exhibiting endless electromagnetic continuity and affording signal phase inversion of an electromagnetic wave type signal, and path-associated active means. Functionally, preferred electromagnetic traveling wave recirculation of such endlessly electromagnetically continuous path can produce pulses with a repetition rate having a time constant related to and effectively defined by the electrical length of said signal path. Such endless signal paths are inherently unterminated so free of termination and reflection problems, and low impedance is not a problem as only "top-up" energy is required to maintain amplitude of pulse waveforms. Fast switching said path-associated active means is advantageous to direct production of highly square wave forms, with rise and fall times according to switching between voltage levels and spacings thus pulse duration according to transit of said signal path.

Such operation can be viewed as effectively repeating traversal of said signal path by a voltage level transition that can be very fast, the transition being effectively inverted by its said signal path traversal. Suitable said signal path can be of transmission line nature, as realizable for ICs on an on-chip basis by such as microstrip, coplanar waveguide or stripline lithography using resist patterns and etching. Functional signal path implementation can be as substantially parallel double-loops with insulated cross-over formation, traceable as a substantially linear conductive formation of Mobius ring effect. Practical active means achieving signal top-up or regeneration can be as cross-coupled bidirectional amplifiers between such double-looped conductive formations, say using N-channel and P-channel mosfet transistor formations as for typical CMOS VLSI chips. Practical dielectric includes silicon dioxide, e.g. field oxide or inter-metal dielectrics, but substrate dielectrics are usable when of semi-insulating or SOI (semiconductor-on-insulator) nature.

Rotary traveling wave clocking can be provided well into the plus- and plural-GHz frequency ranges even using current CMOS fabrication technology. The popular synchronous paradigm can be maintained, with such high frequencies available all over the chip areas by readily extendable plural frequency locked loops. There is no need for conventional external quartz crystal signal source nor for internal phase-lock loop (PLL) multiplication or other control. Also, the termination and reflection problems of conventional H-tree signal distribution do not apply; and there are predictable phases/phase relationships at all points (coherency), so clear practicality for moving away from the single-phase synchronous paradigm and its very high power spikes.

SUMMARY OF INVENTION

According to aspects of this invention, electronic pulse generator or oscillator circuitry comprising a signal path exhibiting endless electromagnetic continuity affording signal phase inversion in setting pulse duration or half-cycles of oscillation within time of signal traverse of said signal path, and having active switching means associated with said signal path to set rise and fall times of each said pulse or said half-cycle of oscillation, is further characterized by one or more of the following:

- maintaining substantially uniform transmission line impedance by geometric layout
- providing desired high impedance relative to voltage peaking
- controlling pulse edge rates according to number of active switching means and/or relating time of flight for tap connections to desired timing pulse rise and fall times
- operating frequency adjustment by
- thickness of dielectric coating of wafer
- applying passivation layer, say ferrite
- trimming capacitive and/or inductive components
- charging physical layout say to alter loop electrical length
- switching sections of transmission line in or out
- minimizing cross-conduction, say by selecting between early and late signals
- reducing cross-talk by signal line placement and/or transmission line crossovers and/or additional transformer trace and/or adding coupling capacitance
- assuring rotation direction by offsetting gate and drain connections of mosfet said active switching means and/or internal magnetic coupling and/or power sequencing and/or attenuation for undesired direction and/or using inherent RC to delay transistor switching-metal traces at least partially off-chip, say on another chip in flip-chip manner
- CAD layout principles and methods
- power supply including distribution and/or voltage charging and/or DC-AC and AC-DC conversion arranging paralleled paths of current carrying conductors to reduce inductive differences between connecting or intersection positions joggling co-parallel conductor filaments periodically, say using crossovers to even up effective electromagnetic effects capacitance loading to equalize current density tracking to equalize each wave magnetically and improve current skewing simultaneous two-way synchronous data transfer bus, preferably in association with two physically separated but coherently synchronous clocks to control transmission and reception bits preferably on a two phase basis, has one or more of the following further provisions for compensation for induced crosstalk at source, conveniently by current injection, to reduce preferably negate need for physical separation of conductors using receive signal conductors and transmission return-current lines during transmit, thus avoiding need for separate ground trace accommodating signal attenuation, including frequency dependent attenuation, by allowing half-cycle pulses to decay between cycles so that there is no memory of previous bit values (as common in NRZ signaling format)

multiphase transmission to avoid ground bounce problems including to where only one line is switching at any one time.

accommodating high losses thus helping to isolate return reflections (normally considered problematic).

frequency control by varactor means associated with said signal path additionally to said active switching means, say as differential mosfets with common high resistance control line—temperature and/or voltage compensator means associated with said signal path additionally to said active switching means, preferably as plural distributed compensators say as diffusion diodes—localized impedance variation for said signal path, say to counter heavy capacitance loading effects synchronous interconnection of plural said signal paths by way of lossy means semiconductor-on-insulator fabrication for lesser parasitic effects adjusting rotating wave period by switchable active meter elements transmission line switching for injection of control signal, say of test nature-controlled linking of said signal paths for frequency multiplication phase adjustment by means associated with said signal path additionally to said active switching means, say to compensate 4-phase logic timing signal components for skew from such as temperature effects adjusting frequency by inductance dependent reduction thereof including by design according to selective proximity of parts of loop component conductors hereof and resulting mutual coupling/differential inductance, including spiral formations that can be of superposed nature power saving without stopping rotary timing operation hereof including by staticising data lines and logic result lines using latch means, say along with choking and holding provisions for data lines.

BRIEF DESCRIPTION OF DRAWINGS

Exemplary implementation of aspects of this invention through various specific embodiments is now described with reference to the accompanying diagrammatic drawings, in which:

FIGS. 11a-d show coupling correlation/reduction;

FIGS. 14a-e show various circuit detail of latch, oscillator, counter, gating and regulator functions;

FIGS. 15a-e show symbolic, schematic and equivalent circuitry;

FIGS. 16a-d relate to power supply and conversion;

FIGS. 19a-g concern array and matrix synchronous input/output;

FIGS. 20a & b concern capacitive compensation;

FIGS. 22a-d concern operation with reduced parasitics;

DESCRIPTION OF ILLUSTRATED EMBODIMENTS

Figure 1:
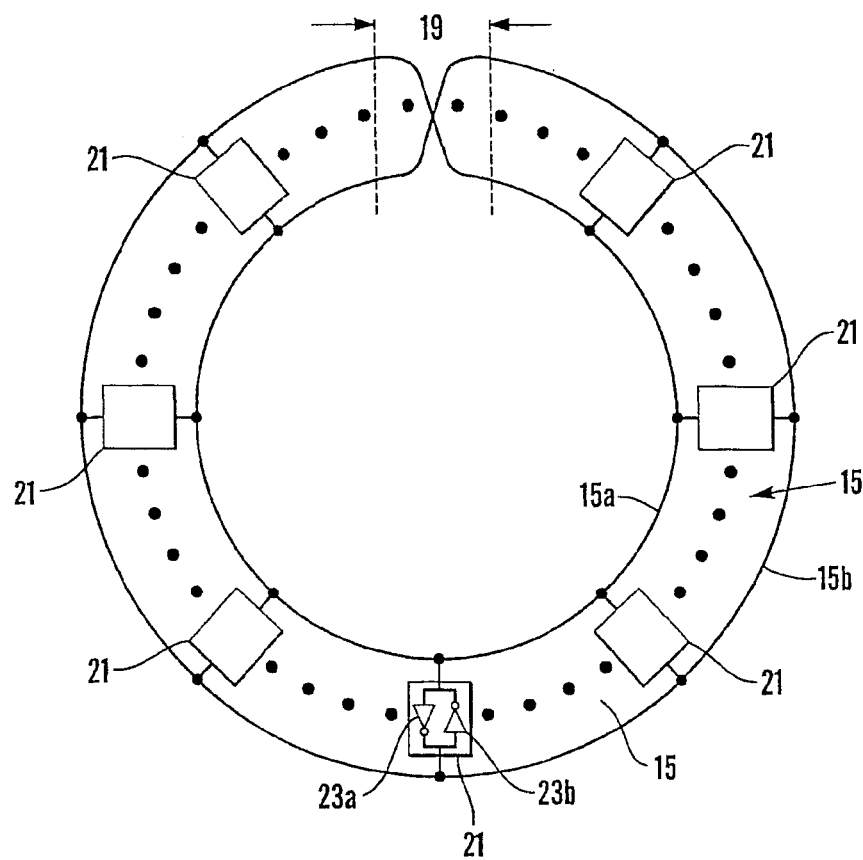
FIG. 1 is a circuit diagram for a pulse operation or oscillator.

FIG. 1 shows a transmission-line 15 as a structure that is physically as well as electromagnetically endless, specifically comprising a single continuous "originating" conductor formation 17 shown forming two appropriately spaced generally parallel traces as loops 15a, 15b with a cross-over at 19 that does not involve any local electrical connection of the conductor 17. The length of the originating conductor 17, taken as S, corresponds to two 'laps' of the transmission-line 15 as defined between the spaced loop traces 15a, 15b and through the crossover 19. The cross-over 19 produces a Moebius strip effect where edge traces of the loops 15a, 15b invert from lap to lap.

As a pulse generator, actually an oscillator, the transmission-line 15 has associated plural spaced active means 21 conveniently of bi-directional switching/amplifying nature shown as two inverters 23a, 23b connected back-to-back between the conductive loop traces 15a, 15b. Alternative active regenerative means could rely on negative resistance, negative capacitance or be otherwise suitably non-linear, and regenerative (such as Gunn diodes). Respective input/output terminals of each circuit 21 are shown connected to the transmission-line 15 between the loops 15a, 15b at substantially maximum spacing apart along the effectively single conductor 17, thus each at substantially halfway around the transmission-line 15 relative to the other.

Figure 2:
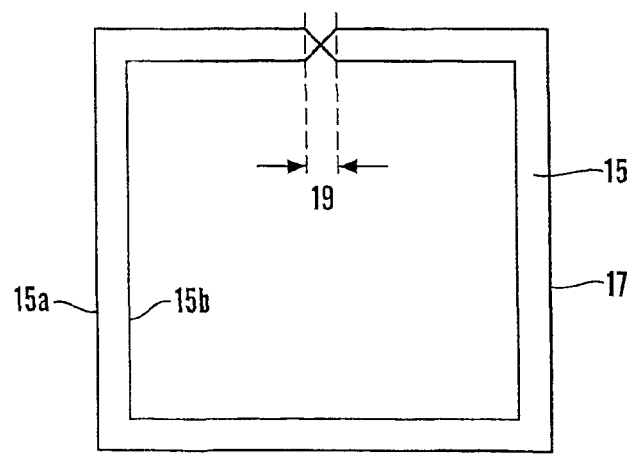
FIG. 2 is a convenient simplified representation.

FIG. 2 shows convenient simplified/idealized representation that omits the active means 21. These can be any odd number of cross-overs 19, and transmission line loop 15 can be any shape, including geometrically irregular, so long as they have a length appropriate to the desired operating frequency, i.e. so that a signal leaving an amplifier 21 arrives back inverted after a full 'lap' of the transmission-line 15, traversed in a time Tp effectively defining a pulse width or half-cycle oscillation time of full-cycle bipolar operating frequency.

Detailed functional description is given in above-mentioned PCT application, including relative to equivalent circuits. Reference for this and any other purpose is directed to that PCT application. Initially chaotic amplification of inherent noise within the amplifiers 21 will quickly settle to effective oscillation at a fundamental frequency F where $F=1/(2 \cdot Tp)$, typically within nano-seconds.

Endless electromagnetic continuity of the transmission line 15, along with fast switching times of preferred transistors in the inverters 23a and 23b, leads to a strongly square wave-form containing odd harmonics of the fundamental frequency F effectively reinforced. At the fundamental oscillating frequency F, the terminals of the amplifiers 21 appear substantially unloaded, due to the transmission-line 15 being 'closed-loop' without any form of termination, which results very desirably in low power dissipation and low drive requirements. The inductance and capacitance per unit length of the transmission-line 15 can be altered independently, as can also be desirable and advantageous.

The evident continuous DC path evident directly connecting all inputs and outputs of the inverters has no stable DC operating point, and this DC instability is compounded by the regenerative (+Ve feedback) action of back-to-back inverters. For any transistor and its output signal path with reference to the ground plane, its output arrives back at its input after one lap of the transmission line 15—in either clockwise or anticlockwise direction, both waves being launched and arrive back together. Self-sustaining reinforcing action occurs when the input arrives 180-degrees out of phase with the output and additional 180-degrees phase shift of the inverter contributes to such reinforcing.

Figure 3A:
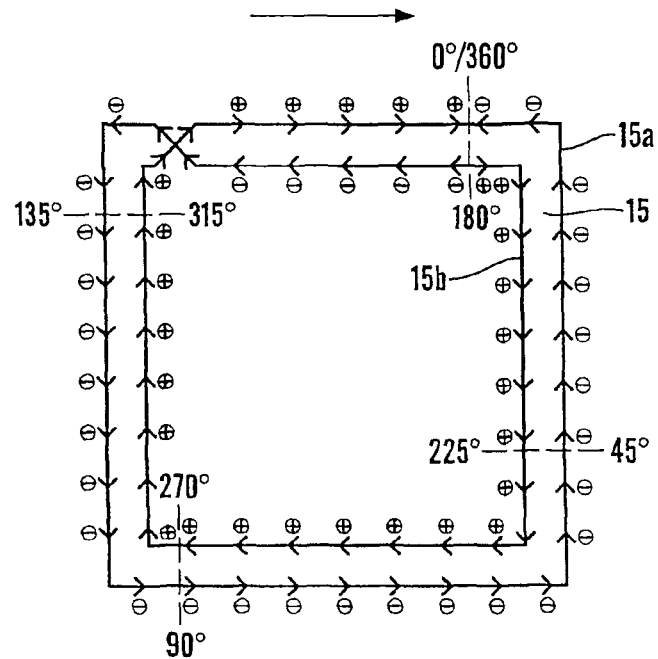
FIGS. 3a, b indicate alternative directions of traveling wave rotation.
Figure 3B:
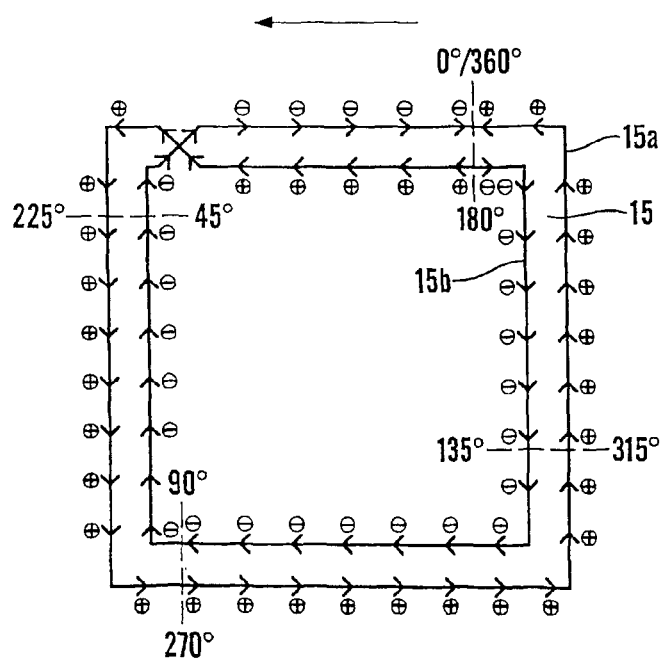

Coherent pulse/oscillation operation occurs when the signal in the transmission line meets this requirement for all connected inverters, so all inverters are working in a coordinated manner with known phase relationship between all points on the transmission line. This criterion is met only when there is a single rotating traveling wave in the line, i.e. rotating either clockwise or anticlockwise, see FIGS. 3A and 3B showing line current flow by arrow-heads, polarity by circled plus and minus signs, direction of rotation by full arrows, and phase from arbitrary 0/360 degree position, for a two-lap traverse of the path 15. During rotation, the wavefront incident a transistor overrides its previous drive direction due to low wave impedance compared to a single transistor. Once overridden, the transistors contribute to imposing the new wave polarity by reason of connecting the transmission line terminal to the correct power source polarity—which maintains 'top-up' energy to give constant amplitude in the presence of (mainly resistive) losses in the transmission line. Switching by the transistors also helps prevent the build-up of any counter-direction waves, effectively acting as wave gates.

Once rotation has been established in one direction it could change only if the electrokinetic energy in the structure was removed and reversed. To complete a full bipolar cycle of oscillation generation, a wave must make two 'taps' of the structure in order to complete a 360 degree phase shift, i.e. each complete lap is only 180 degrees of phase shift. Rapid rise and fall times are a consequence of the short transit-time of the mosfets, typically 1 to 5p5 range in VLSI CMOS. The transistors do not drive a capacitive load, as load and gate are switched by the incident wave, i.e. operation is transit time limited, and the waves are thus square with very good symmetry between. phases.

Figure 4A:
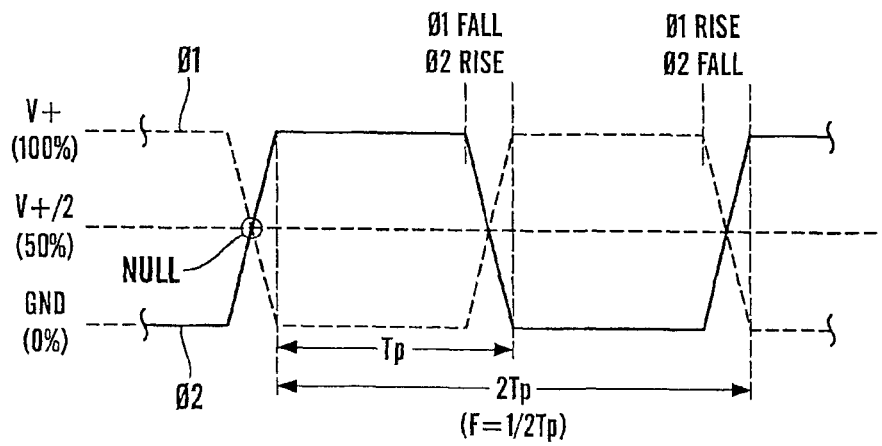
FIGS. 4a, b show idealized differential waveforms and relationship between propagation delay and electrical/physical lengths of a transmission line.

FIG. 4a shows idealized waveforms for a switching amplifier 21 with inverters 23a and 23b. Component oscillation waveforms (D1, 02 appear at the input/output terminals of that amplifier 21 shortly after the 'start-up' phase, and continue during normal operation. These waveforms (1i1 and C'2 are substantially square and differential, i.e. two-phase inverse in being 180 degrees out-of-phase. These differential waveforms 01 and '2 cross substantially at the mid-point (V+/2) of the maximum signal amplitude (V+). This mid point (V+/2) can be considered as a 'null' point in a voltage level transition. For the preferred re-circulating traveling wave operation, this null point and voltage level transition effectively sweep round the transmission line 15 producing very fast rise and fall times in a very 'clean' square-wave form definition.

Figure 4B:
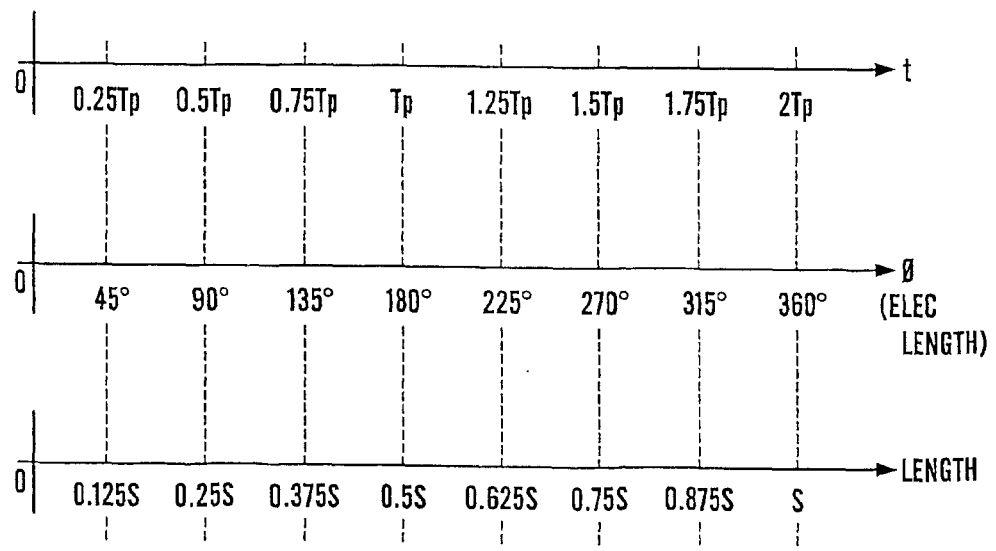

For the transmission-line 15, it is convenient to consider complete laps as traversed by a traveling wave, and also total length S of the originating conductive trace 17, both in terms of 'electrical length'. FIG. 4b shows relationships between the propagation delay or traverse time (Tp), electrical length in degrees, and physical length (S) of originating conductive line/trace 17. For each of the out-of-phase waveforms 4D1 and 472, and as seen by a traveling wave repeatedly traversing the transmission-line 15, each substantially square wave excursion corresponds to one complete lap, i.e. one traverse time Tp, and successive opposite wave excursions require two consecutive laps, i.e. two traverse times (2×Tp). One lap of the transmission-line 15 thus has an 'electrical length' of 180 degrees, and two laps are required for a full 0°-360° bipolar signal cycle, i.e. corresponding to the full lengths of the originating conductor 17.

Figure 5A:
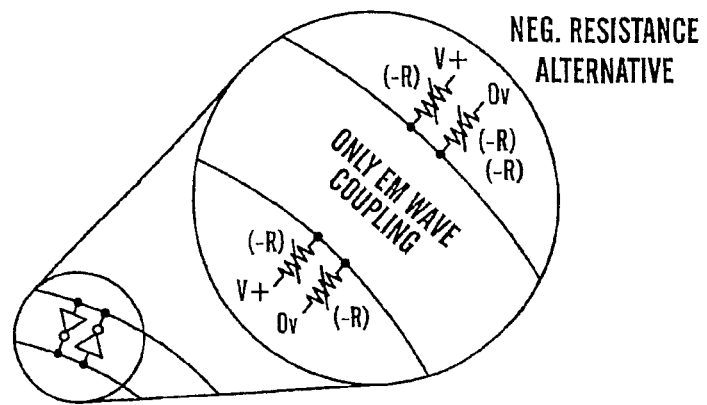
FIGS. 5a, b indicate alternatives by way of negative resistance switching means and single-ended operation, respectively.
Figure 5B:
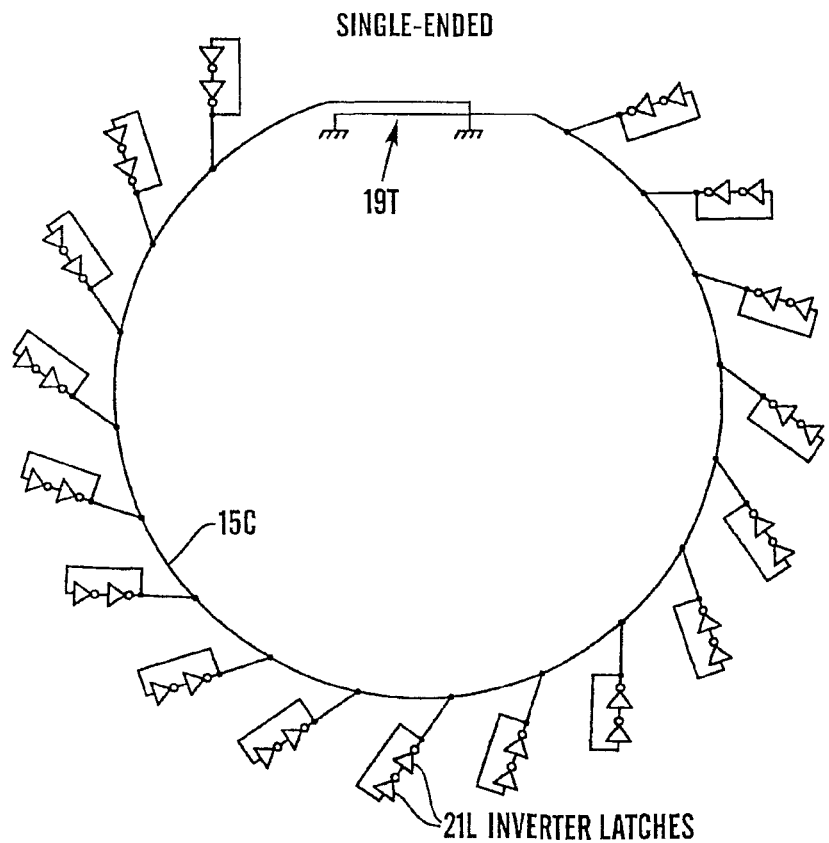

The CMOS inverter symbol as used herein is a kind of shorthand. In practice, the number of Nch and Pch devices need not be the same, nor need they be co-located. The basic requirement is to distribute a number of small width devices along the path of the transmission-line connected appropriately. Typically, each device has an on-resistance substantially higher than the impedance of the transmission-line, while the total paralleled resistance of all devices is of the same order as the impedance of the line. This is to ensure the devices can be overridden by an incident wave and strong oscillation characteristics respectively. Alternatives to more common CMOS devices include Nch+ pull-ups, Pch+ pull-downs, Bipolar transistors, negative resistance devices (e.g. Gunn diode), or Mesfet etc., see FIG. 5A where there will be no cross-coupling other than by way of electromagnetic coupling.

Single ended operation is also available between a conductor and AC ground as indicated in FIG. 513, again showing an electromagnetically endless signal path 15C with an inverting transmission line transformer 19T and inverter latches, as active switching means 21L, though their delay time is likely to affect frequency and the charge at the second inverter is not energy recycled as efficiently as above-preferred differential structure/operation.

The transmission line 15 is readily implemented as coplanar strip by two parallel conductive traces, usually metal to those may be lower and/or upper conductive ground phase layers still allowing viable differential transmission line operation, but also affording common-mode propagation between each trace and AC ground. Also, in principle any method of signal inversion can be used, i.e. other than a cross-over, e.g. an inverting transmission line transformer. With differential signal transmission mode coplanar strips and back-to-back inverters, differential signals are output by the inverter pair with signal energy launched to the transmission line inductively and capacitively by magnetic and electric fields between the signal conductors as well as each signal conductor and ground (or two individual common-mode paths).

Figure 6A:
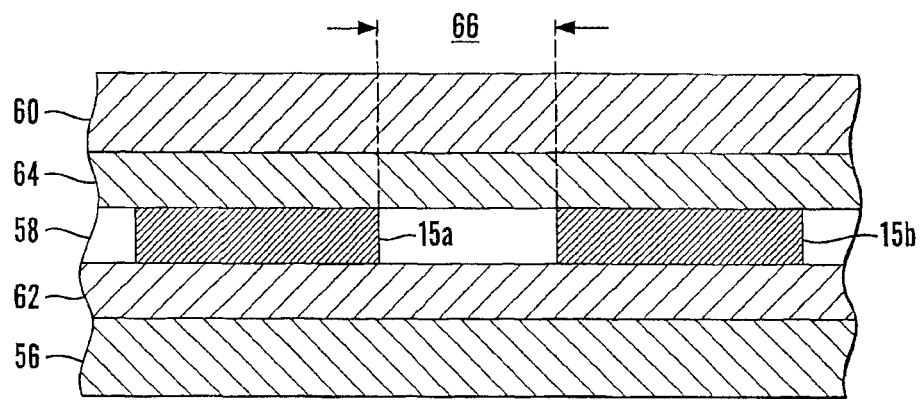
FIGS. 6a-e indicate alternative coplanar loop or ring conductors.
Figure 6B:
Figure 6C:
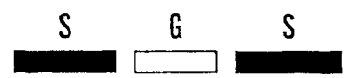
Figure 6D:
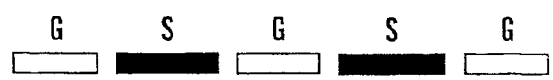
Figure 6E:

FIG. 6A is a cross-section through a portion of one exemplary on-IC transmission-line formation comprising three metal layers 56, 58 and 60 and two dielectric layers 62 and 64. Middle metal layer 58 is illustrated as comprising the two transmission-line loop conductive traces 15$a$ and 15$b$ that are at least nominally parallel. Upper metal layer 60 could be used as an AC 'ground' plane and could be connected to the positive supply voltage V+, lower metal 56 being a 'ground' plane that could be connected to the negative supply voltage GND. The dielectric layers 62 and 64 between the metal transmission-line traces at 58 and 'ground' planes 56 and 58 are typically formed using silicon dioxide ($SiO_2$). The full illustrated structure is seen as preferable, though maybe not essential in practice, i.e. as to inclusion of either or both of the 'ground' planes and the dielectric layers 62, 64, The physical spacing 66 between the conductive traces 15$a$, 15$b$ affects the differential and common modes of signal propagation, which should preferably have equal, or substantially equal, velocities in order to achieve minimum dispersion of the electromagnetic field from the spacing 66. Screening properties improve with use of 'ground planes', as does the ability for the structure to drive non-symmetrical, i.e. unbalanced, loads applied to the conductive traces 15$a$, 15$b$. FIGS. 6B-D show alternative coplanar 1 provisions believed to be largely self-evident for ground central (6C) rather than flanking a signal pair (6B), grounds flanking and central (6D), and a multiple arrangement (6E) with central ground split flanking a specific data line and flanking outer grounds, respectively. Non-planar layouts can be distributed between different layers of metallization with appropriate vies and straps (not shown).

Figure 7A:
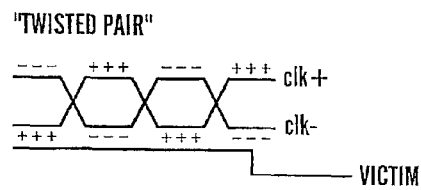
FIGS. 7a, b are useful regarding cross-talk with another signal path.
Figure 7B:
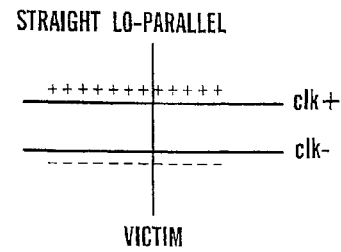

FIG. 7A shows that differential transmission line traces with a crossing signal path on another metal layer have little if any cross-talk effects as and where in co-parallel relation. FIG. 7B shows "twisted pair" type cross-oval in the differential transmission line traces to reduce cross-talk relative to a parallel other signal path, the cross-overs being at intervals that relate to pulse direction between rise and fall times; with some increase in capacitance per unit length of the transmission line.

Figure 8:
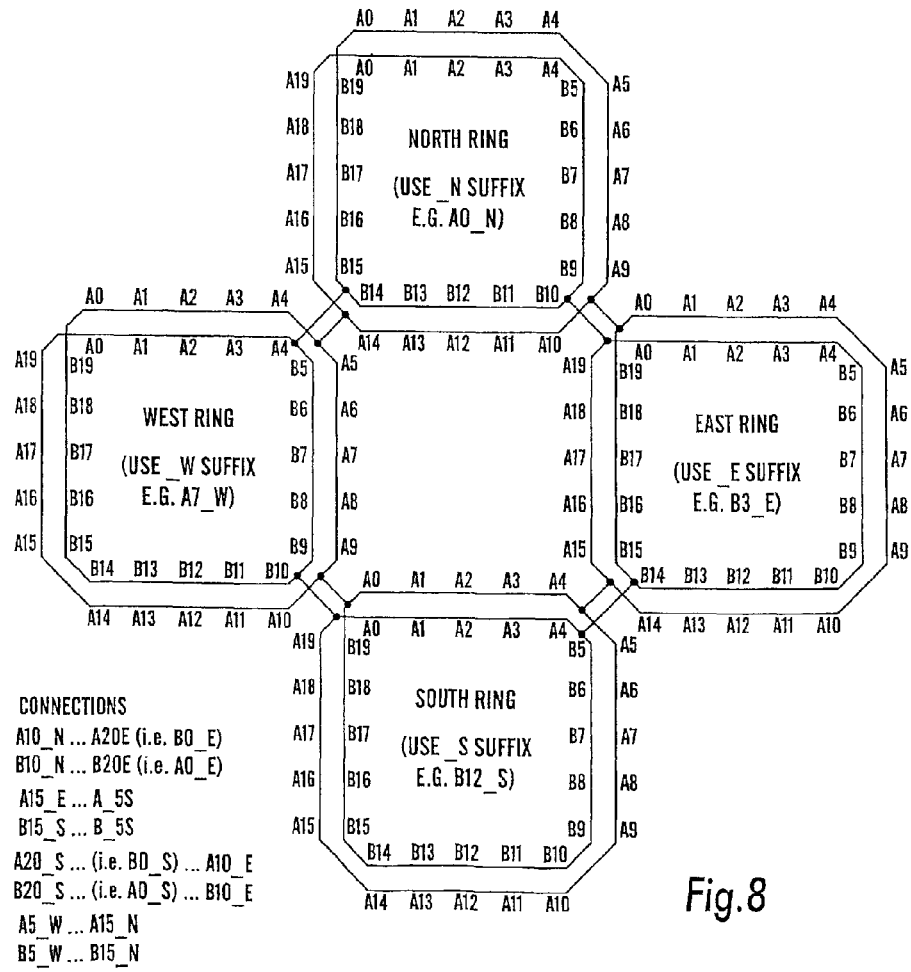
FIG. 8 shows tap-positions and interconnections of four loops or rings.
Figure 9:
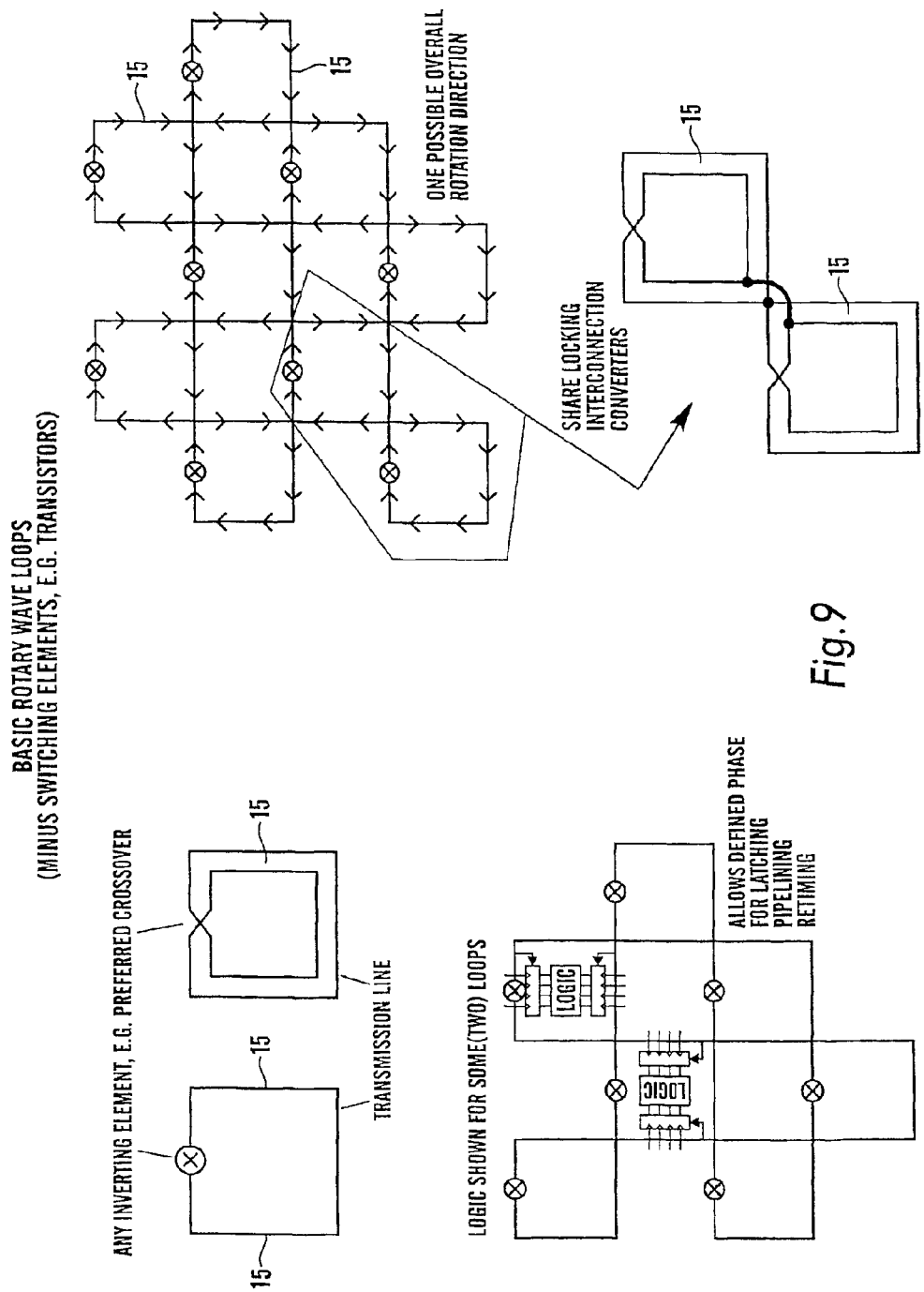
FIG. 9 shows symbolic representations, connections to logic, and interconnections for plural loops or rings and one rotation direction.

FIGS. 8 and 9 show how multiple single rings can be 'gridded' to cover a large area. Each loop maintains the same frequency as when operated in isolation. Placement and locking interconnection of four rings as shown in FIG. 8 produces by default an inner ring. An arbitrary connection position code is indicated on a twenty per outer (A) and inner (B) line basis with loop suffixing (N, E, S, W). If such process is repeated, a configuration as in FIG. 9 can result in twice the area coverage because of the virtual rings formed (which as real and effective in practice as the actual rings). By virtue of the electrical connections between the rings, oscillation becomes phase-locked overall. As shown by the direction of the arrows, adjacent rings must have waves which rotate counter-clockwise to each other. Electromagnetic coupling from field interactions at the junctions will also reinforce the counter-direction wave directions. Such structure can be extended indefinitely. Clock frequency is then no longer a size-determined constraint for practical purposes. The system resembles intermeshed mechanical gears, the rings being 'cogged' to each other as for a gear-train, and on a coherent wave-locked basis for a large area integrated circuit FIG. 9 includes and uses simplified double-line loop/crossover and more generalized single-line indication with circled-X for any inverting element representation.

Conventional clocking topologies try to maintain a 'clock surface' in attempting to make rising and falling clock edges occur simultaneously over the entire chip or system with all unwanted variation called "skew". Inevitably, this means massive current spikes in the VDD and 0 v lines during the clock transition times (could be 25 A or more at full clock frequency). On-chip decoupling capacitors and hybrid above-die capacitors are often required to maintain proper device operation. Even with these measures, supply bounce is large and eats into the voltage 1 margins for the gates. Rotary wave clocking hereof could be applied as for a conventionally clocked chip, i.e. to generate local 'same-phase' clocks as a replacement for the usual clock tree. Reduced skew and lower power will result, but the biggest advantage comes when the logic can be laid out using special Cad-tools to be clocked in the direction of data-flow. The known phasing at all positions on the rotary wave clock lines allows confidence that setup and hold times can be maintained Taken to the limit, rotary wave clocking could result in progressive wave clocking of an entire chip during the course of a complete cycle. Clock surging would be eliminated and the power supply would tend towards DC.

Figure 10:
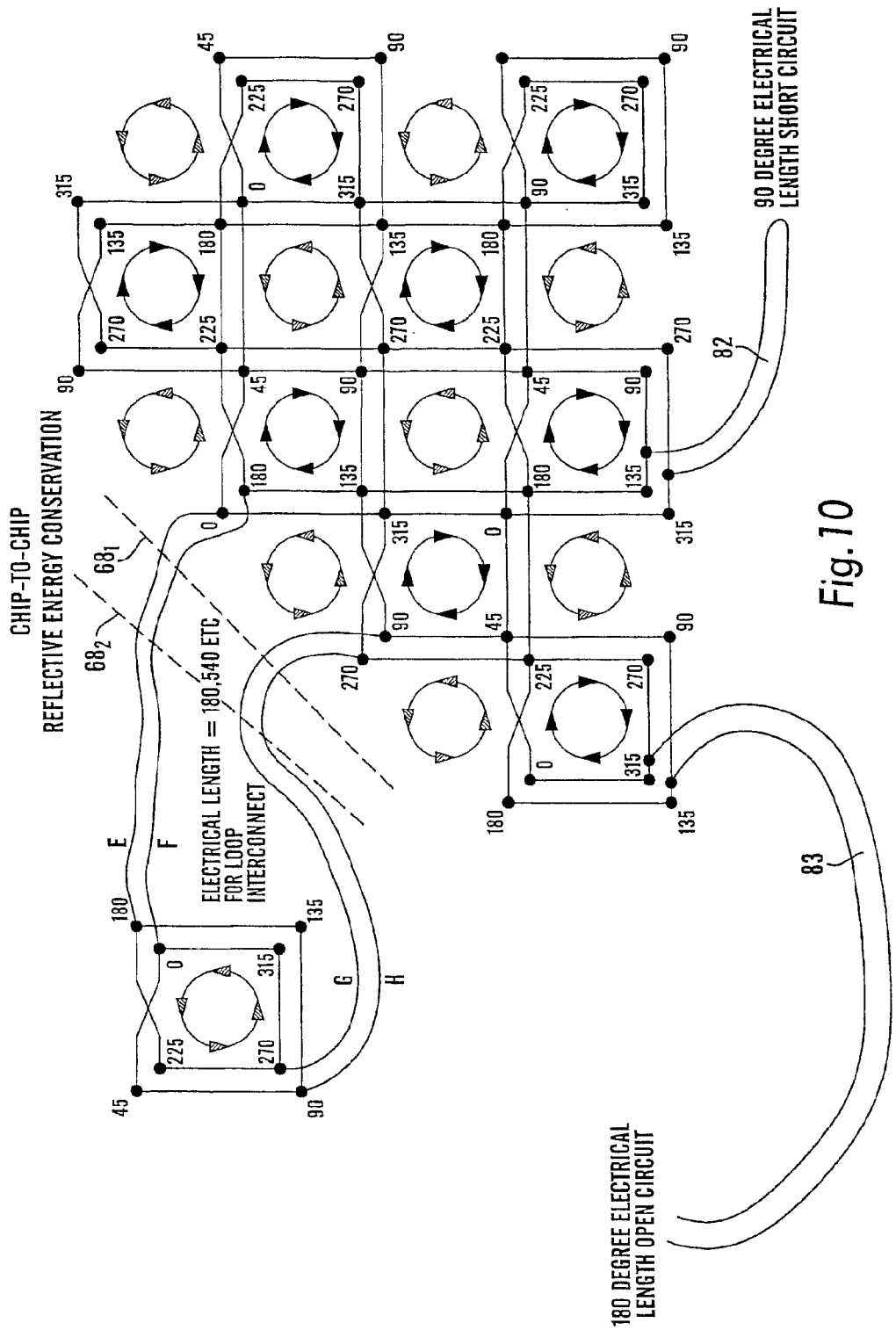
FIG. 10 shows further extension and interconnection between chips.

FIG. 10 shows one example of coherent frequency and phase operation of two clock distribution networks of two monolithic ICs $68_1$, $68_2$ each having a clock generation and distribution hereof and pairs of inter-IC connections E, F and G, FL The two ICs concerned will operate coherently, i.e. at the same frequency and with the same phase relationships, where each of the connections is substantially of 180-degrees electrical lengths, or a multiple satisfying 360°.n+180° where n is zero or an integer. A single pair of inter-IC connections (E, F or G, H) will result in frequency and phase 'locking'. More than one pair of inter-IC connections (E, F and G, H as shown) will result further in clock wave direction or rotation locking The clock rings or loops can be passive or active, free wires cannot usefully be active and some active sections can serve to input energy. Kirchoff-like rules apply to signal or energy branching and combining.

Also shown in FIG. 10 is a first and second 'stub' connections 82 and 83, though there could be more of either or each. The first stub connection 82 has a total electrical length of 90° to a short-circuit and is acceptable anywhere so long as not active. The second stub connection 83 is open-circuit and of 180° electrical length and can be helpful for stabilization. Such stubs 82, 83 can be particularly useful for non-IC applications of the invention where conductive trace definition may be less precise than for ICs. Impedance of the pairs of connections E, F and G, H and connections 82, 83 can have any value since, in normal operation and once these connections are energized, there will be no net power flow therein for correct phasing thereof. It is, however, preferred that the impedance of these connections E, F and G, H and 82, 83 is greater than that of oscillator transmission-lines 15 to which they are connected. These connections will support a standing EM wave rather than a traveling EM wave. Free wire interconnects can be of any characteristic impedance as no net power flows through them in normal operation at correct phasing (unlike the clock loops which circulate energy with directional rotation in normal operation).

Such FIG. 10 inter-connections can be applied equally well to infra-IC, inter-IC, IC-to-PCB and/or any non-IC, i.e. PCB-to-PCB system connections.

It is usually desirable to maintain substantially uniform transmission-line impedance for active transmission-line structures hereof, but some advantage for waveshape control may be gained by deliberate impedance control, e.g. by geometric layout. Local high-impedance can induce voltage peaking, say perhaps to maximize drive signal on clocked-gates. High impedance can be due to decreasing capacitance or increasing inductance locally, say by possibly reducing capacitive loading or spacing conductive traces wider, respectively. Locally lower impedance might be useful for driving a highly capacitive net.

Normal rise and fall times tend to be in the 5-15 pS range for 0.1 u-0.25 u CMOS process geometries, and is usually advantageous for better defined switching events and lower cross-conduction losses. However, if crosstalk to neighboring electrical traces suggests a slower edge rate, edge rates can be controlled in simple ways. One is to reduce the number of 'top-up' amplifiers keeping total transistor width constant, which gives a higher lumped-C effect at the amplifiers, larger series inductance between the amplifiers and therefore a natural distributed LC shunt tank circuit. This can be designed precisely for cut-off frequency to cut-off of the higher frequency harmonics in the otherwise square waveform, reducing the edge rate. Another way is to design all 'tap' connections from the main ring to have a return time-of-flight back to the ring of approximately the desired rise/fall times so those lines then act as frequency-selective stubs and inhibit rise/fall from occurring until the round-trip delay time of the tap has passed.

Whilst operating frequency is consequently determined at design time by physical layout, there several ways of providing some measure of adjustment.

Adjusting the thickness of the dielectric overcoat (overglass) on the wafer can adjust operating frequency, and is apposite to account for process variability. Typical thickness of <1 u could be increased up to 5 u to increase the capacitance per unit length of the transmission lines located on top-metal Phase velocity will be slowed as more electric field lines are in dielectric (rather than in air). A wafer designed to run 'too-slow' by having maximum dielectric thickness can have the dielectric 'etched-back' to achieve the desired trimmed operating frequency. The amount of etch back required can be determined by pre testing the wafer to determine the change in permeability required.

Another way of controlling phase velocity is by ferrite coating above the top layer of passivation to alter the magnetic permeability of the medium surrounding the transmission-line conductors, say applied by sputtering. A 5 u thick coating of μR=100 could lower the phase velocity by up to 10-times and also increase the impedance by up to 10-times. A subsequent mask-etch step could leave ferrite covering only those regions above clock lines. Other lines would not be greatly affected.

Selectively switched current components such as capacitors or varactors can be used to adjust circuit parameters (e.g. capacitance) and alter oscillating frequency. Changing the operating frequency by physical alteration of the layout is another option. Effectively these methods increase/decrease the total loop electrical length, e.g. by changing inductance or capacitance or both. Sections of transmission line can be 'switched-in' or 'switched-out' using combinations of transistor-switching, fuse-link, anti-fuse technology, ion-beam milling, laser cutting, fusing, etc. Such segments can be mainly capacitive or mainly inductive or of balanced LC in nature.

Fast signal waveforms on such as clock lines can be sources of unwanted electric and magnetic coupling to neighboring conductive signal traces, and such coupling can increase with frequency and edge rate. Differential clock systems hereof reduce these effects because each of clock line signals are accompanied by equal-and-opposite inverse signals, and interactions tend to cancel to zero, at least remote from the pair. Close to one line only of the pair, however, coupling may still be strong and "twisting" the pair helps to neutralize this effect, see FIG. 7.

Simply placing other signal lines substantially registering with mid-way between the two lines of a loop hereof can be useful, see FIG. 11B, as there is no net magnetic or electric coupling provided the lines either side are balanced as to mutual capacitances and inductances, and are differential. Generally for FIG. 11, use is assumed of two adjacent metallization layers (M5, M4). Other compensatory action can be by adding a parallel "transformer" trace tending to neutralize imbalance of mutual inductances between victim trace and the pair of loop inducting lines, see FIG. 11A where solid arrow heads show current flow and circled-plus and -minus show electric potentials, and the traveling wave velocity will be much less than signal trace velocity.

Alternatively, see FIG. 11C, coupling capacitance can be added between at net subject to interference and one or other of the clock lines, shown coupled to trace A to cancel magnetic and electric supply from trace B. Coupling capacitance can be created automatically by a CAD tool during the layout phase, whether of metal-insulator-metal, poly/polysilicon, depletion or enhancement types. The clock line whose polarity is such as to cancel the effects of unavoidable coupling is chosen. The size of capacitance can be chosen to cancel the effect with an equal but oppositely directed supply of energy.

FIG. 11D shows that if supply connections are within the same magnetic field as the signals, no net coupling effect arises. Magnetic coupled is similar from trace B—the three closely spaced traces VDD, VSIG, USS so signal supplier move together without local corruption. For this to be practical, loops should be provided, and connections to VDD and VSS on the other "A" side of the line should be avoided, else circulating conduction currents would arise.

Figure 12A:
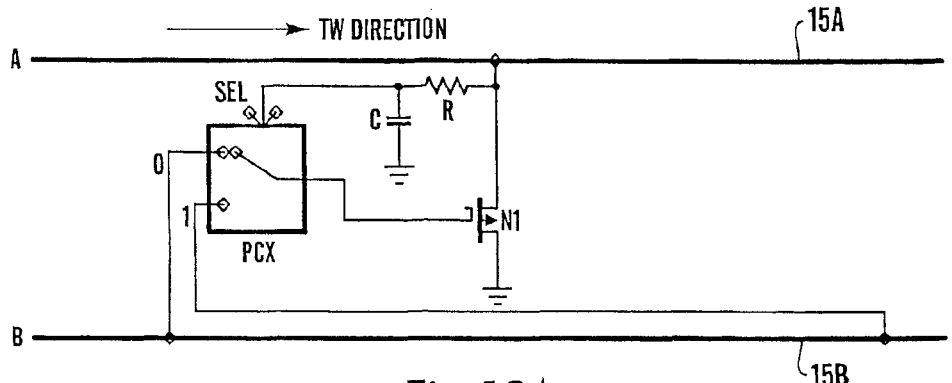
FIGS. 12a-c show cross-conduction reduction and/or rotation direction bias.

Simple cross-coupled connection of two Nch and two Pch transistors can be subject to cross-conduction current, i.e. current going wastefully between the VDD of the Pch and VSS of the Nch when the gate input voltage is such than both devices are on. Cross-conduction is minimized by rapid rise and fall times characteristic of the circulatory wave oscillator, but can be further enhanced, see FIG. 12. FIG. 12A shows a circuit including a multiplexor (MX) to select between 'early' or 'late' signals from the traveling wave line. The 0, 1 connection wires are fast compared with the transmission line AB. R and C delay the changeover until a wave has passed ready for the next half-cycle wavefront. The basic aim is to have all the drive devices switch off 'early' and switch on 'later'. Early and late timing is derived from the traveling-wave line. Application is shown to a single Nch device, but is obviously applicable to all four drive devices of otherwise illustrated bidirectional amplifiers hereof so that the transistors switch off before any other transistor switches on.

Figure 12B:
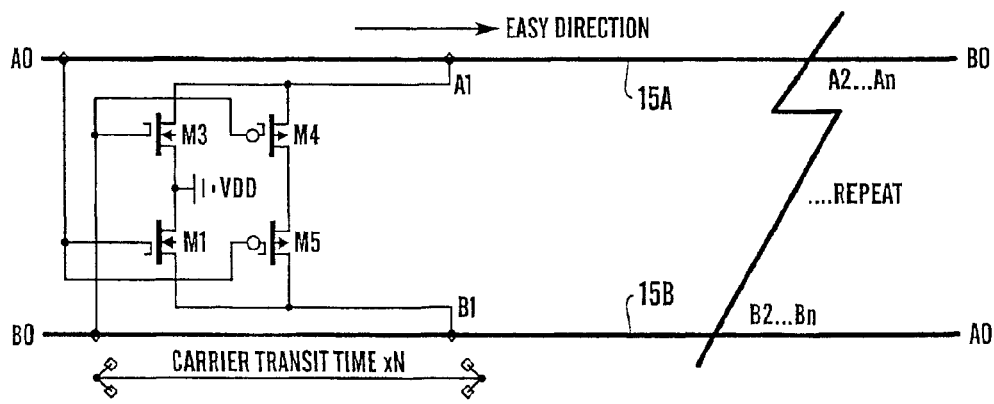
Figure 12C:
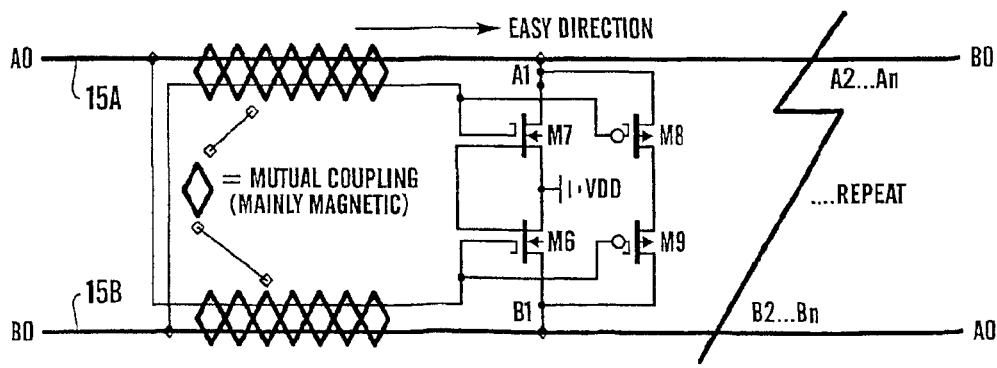

Assurance as to rotation direction of start-up can be provided in various ways. FIG. 12B shows offset gate and drain connections to the transmission lines A and B for the bidirectional amplifiers to promote oscillation start-up in the "Easy Direction" as shown, since drain outputs (normally active after one loop transit time delay) have a coherent delay in the Easy Direction shown. Such provisions can also substantially increase the rate of rise/fall, even down to single figure pS on 0.25 u process. FIG. 12C shows intentional magnetic coupling, which has the effect of adding to turn-off signals to the mosfet gates and subtracting from turn-on signals, thus giving some cross-conduction elimination.

It is also possible to control the start-up direction using power supply sequencing, see FIG. 12D for a power supply voltage which 'powers-up' progressively around the ring, thus tends to cause oscillation to start-up in the direction shown as, without power, no build-up of signal can occur in the other direction during start-up.

Figure 13A:
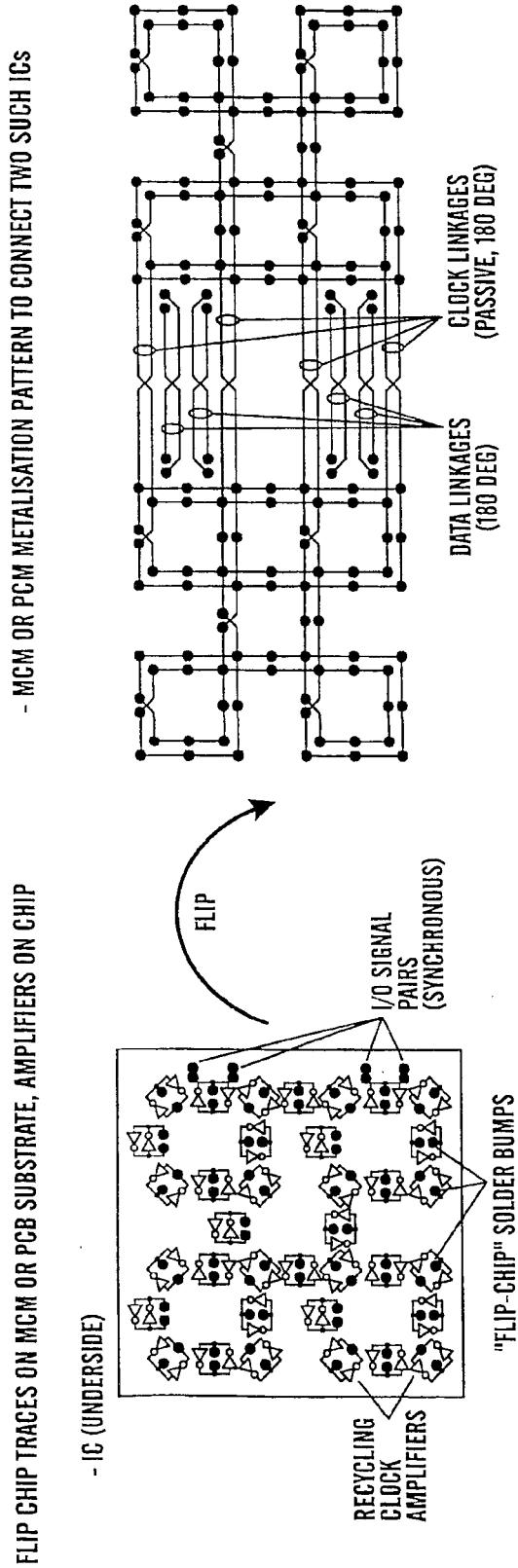
FIGS. 13a-d show flip-chip usage and/or rotation direction startup.
Figure 13B:
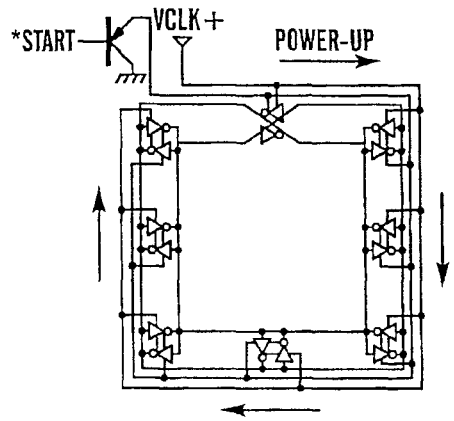
Figure 13C:
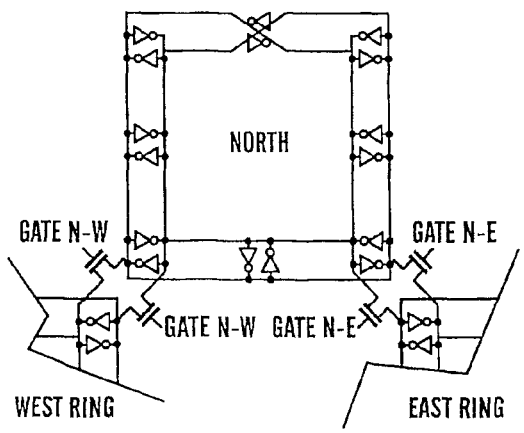
Figure 13D:
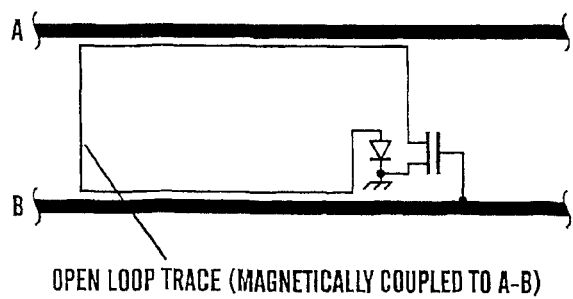

Absorptive methods can be used to attenuate for the undesired direction, see FIG. 13D. A negative leading edge wave traveling from left to right, or a positive leading edge traveling from right to left, would tend to bias the diode to conduction. The Nch transistor can assure that only the first event causes absorption and so limits possibility of start-up in the left-right direction promoting left-right. A full-bridge provision can be made (other than half-bridge as shown).

Another possibility is to use the small inherent RC delay of the gate electrode to delay the turn-on of transistors in one direction. This could be achieved by orientating the mosfets with the channel length perpendicular to the transmission line and connecting one end of the gate towards one direction on the transmission-line, and connecting the drain end at the opposite side of the transistor towards the other direction of the transmission line.

The metal traces used to form the transmission-line structure could be provided at least partially 'off chip' rather than on-chip. So-called flip-chip mounting techniques allow 'top-up' inverters to be pinned out to "bumps", which then connect to a substrate on final assembly. The substrate, typically Alumina, would have the conductor patternation to form the transmission lines of the oscillatory clock network. FIG. 13A shows a typical implementation. Effectively, of course, this can be seen as amounting to top layer metal having been moved 'off-chip'.

FIG. 13B concerns control of start-up direction by power supply sequencing, i.e. powering-up progressively round the ring/loop. Start-up will tend to be in the direction shown as, without power, there cannot be signal build-up in the other direction during start-up.

FIG. 13C shows one way for decoupling and/or digital selection' of clock timing rings as would be useful or required if some rings are active while others are powered down. It also indicates a way of coupling oscillators using analogue gate voltages partially to bring oscillators into phase and rotation sync during initialization.

FIG. 14A shows a basic latch that functions as an inverter. Relatively, N1 is a large device, e.g. w=5 u, and P1 is small device, e.g. w=0.5 u The inverter using N1 P1 thus has a low threshold. P2 is also small device and provides latching action for a logic "0" output. If NPASS does not conduct at less than 1 volt, the CLK signal is advantageously between 1v and 3 v, rather than the usual 0 v and 3 v. NPASS samples the D input onto N1 when the CLK is active high. The capacitive coupling from the CLK through NPASS for a logic 1 at D is nearly sufficient to switch N1,P2. When D is 0 v, N1 is turned off P1 conducts and turns P2 off. FIG. 14C shows a /2 counter implemented using FIG. 14A latches.

FIGS. 14 B, D and E show how negative supply (though it could be and/or positive supply) can be gated or regulated to switch on or control the oscillator supply voltages. Also B shows waveforms in idealized form, say for nominally zero volts at Nch substrate, typically 3 volts for clock positive voltage and typically 1 volt for on-off gating whether on or off chip.

Although timing hereof is inherently capable of clocking any possible synchronous logic family, true differential logic family gates (which output both the true and compliment) can be latched using pass-transistors with no data dependent clock loading. This eliminates data dependent skew (which from simulations is still slight even on non-differential logic). When working with non-differential logic, a Nch+dummy Pch transistor can be used. This balances the data dependent capacitance seen by the clock If the data is "1" then the Pch capacitance exists strongly, if "0" the Nch capacitance is strong. With correct sizing, these capacitances can be the same.

Many types of electronic equipment require electrical power to be supplied at a variety of voltages and currents, i.e. not just one supply at single voltage and current values. AC-DC converter type power supplies are needed for mains (typically 110-250 Vac) to DC (typically 3 . . . 48 volts); and DC-DC convertors are needed between DC levels, e.g. 5 Vdc-3.3 Vdc as is a common for microprocessor applications. Traditional convertors include the categories of electrostatic using charge-pump switched-capacitor techniques, and magnetic using transformer or inductor energy transfer mechanisms. Typically, both use a square wave power oscillator. Low frequencies require the use of large magnetic and/or capacitive components as each must hold energy for long oscillation periods. It is usual to limit operating frequencies to 1-5 MHz because of losses associated with the switching transistors used for the power oscillator.

This aspect of invention builds on a concept in our above PCT application regarding direct application of the rotating traveling wave systems otherwise described in connection with timing signal generation and distribution. This new method is electromagnetic as a combined electrostatic and magnetic energy transport and transfer mechanism combined with contained traveling wave energy supply/transfer/recovery. This electromagnetic method is applicable to GHz operation because of the elimination of most of the transistor switching losses and absorption of normally parasitic capacitances. Higher frequency reduces the sizes of the magnetic and capacitive elements so greatly that they can be integrated on-chip in common VLSI processes, basically as transmission-line networks using planar metal-insulator-metal layers.

A distributed structure combining] inductive, capacitive and semiconductor switching contributions is arranged in an electromagnetically endless loop. For power supply purposes, electromagnetically endless can mean a simple electrical closed loop continuity or a loop with physical discontinuities bridged with e.g. capacitive, inductive or combination coupling but by which a large fraction of energy flowing as a traveling wave is recycled by the closed loop through any discontinuities. Regions of the structure that include active transistor elements constitute distributed square wave oscillation and the distributed synchronous rectifier functions in a dual action. Feedback around the closed electromagnetic path results in start-up from inherent noise. A re-circulating electromagnetic square wave is the stable operating point Rotation in a clockwise or anticlockwise sense is not usually important in this application but bias can be achieved as described above.

The full-bridge connection of Nch and Pch pairs (typically, two of each type) also forms a distributed synchronous rectifier. The transistors which make up back-back inverter pans will always be switched by an incident wave on the transmission line to a state where the two 'On' transistors (one Nch and one Pch respectively) will conduct with the most negative transmission-line conductor going to the local VSS (for Nch) and the most positive transmission-line conductor going to the local VDD (for Pch). Of the four transistors which form the back-back inverter pair, only two (one Nch and one Pch) will conduct at any one time, the other two being switched off. The roles of the two Nch/Pch pairs alternate as the incident wave signal polarity reverses (oscillation). This constitutes a bridge rectification arrangement capable of synchronous rectification and shows the bi-directionality of the DC-AC-DC conversion mode of the system.

Figures 15A, 15B:
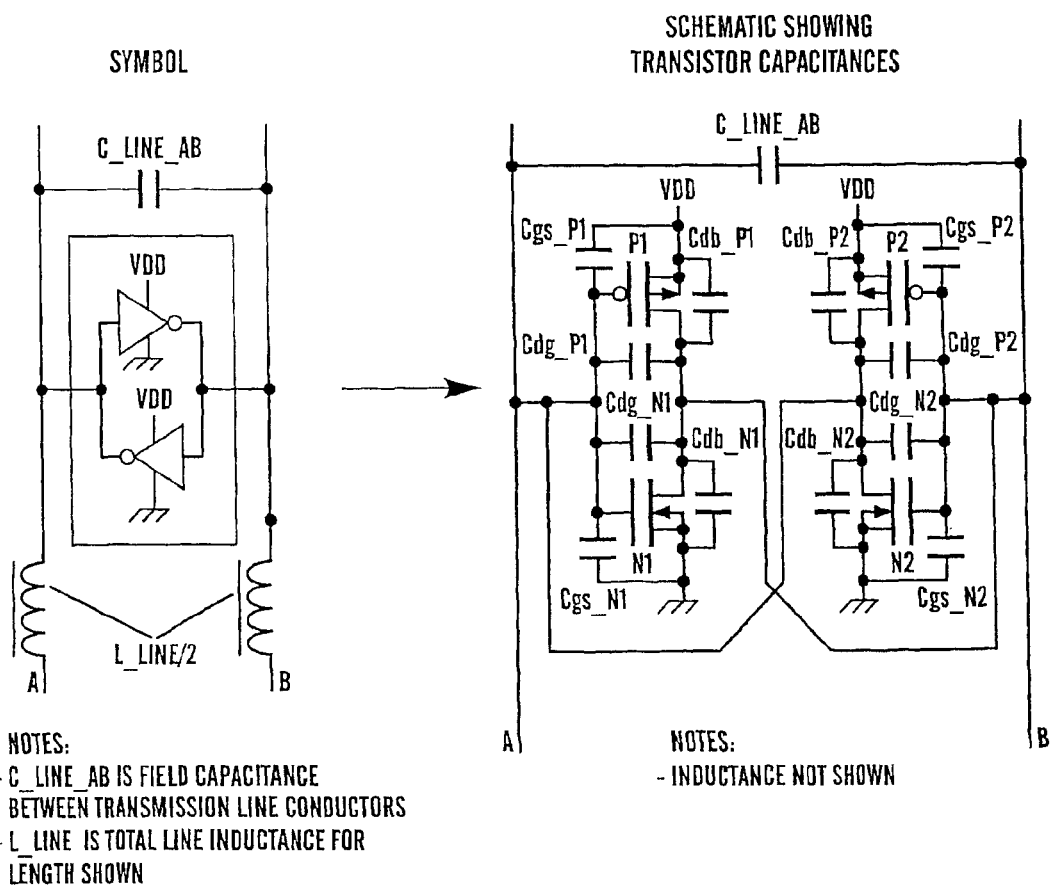
Figure 15C:
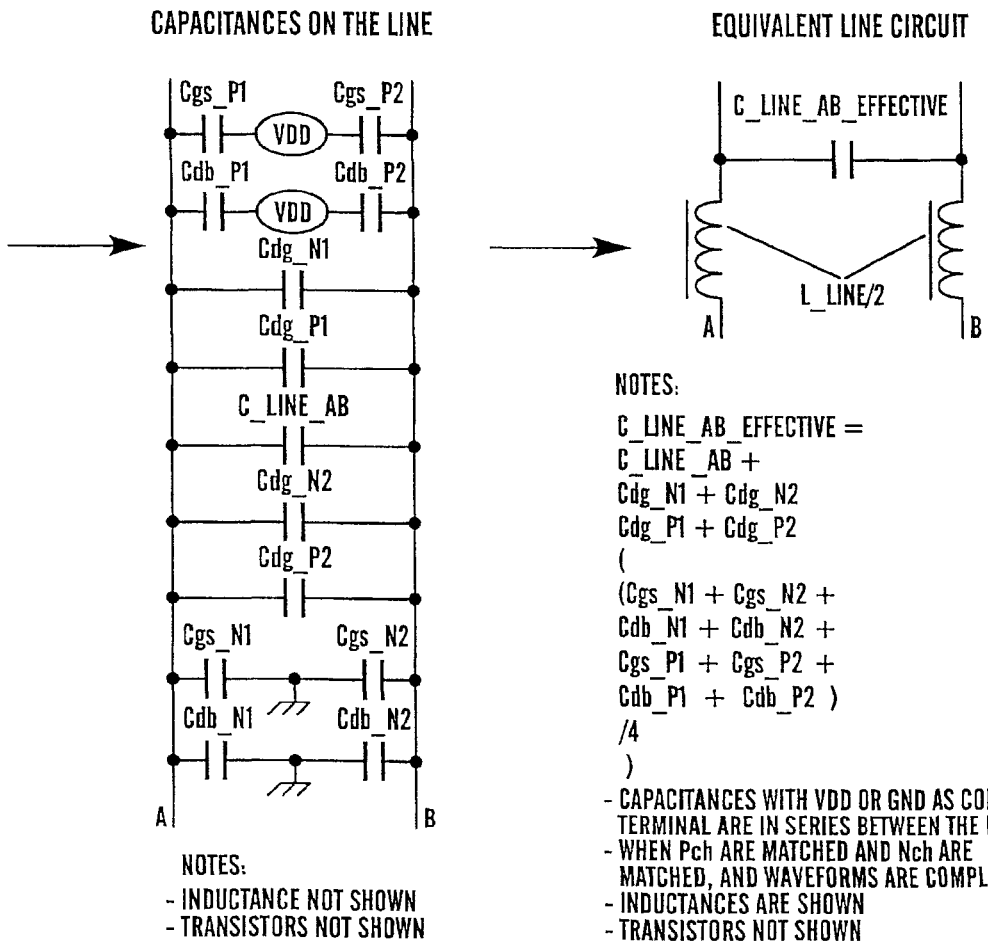

FIG. 15b or 15d illustrate the truth table below.

| Inputs | Pews On | Nch's On | Transistors Off |
|---|---|---|---|
| A = 0 v B = +Ve | P1 (B +Ve) to local VDD) | (A (0 v) connects to local Gnd) | N1, P2 |
| A = +Ve B 0 v | P2 (A (+Ve)N1 connects to local | (A = (0 v) connects local Gnd) | P1, N2 |

The above shows that the circuit is able to extract power to the local supply rails from voltages present on A, B terminals. The circuit is inherently bidirectional. It supplies power to the transmission line when local voltage is greater than line voltage, and takes off power when local supply voltage is less than line voltage (effectively in the same way as a simple resistance is bid sectional).

Power conversion between different voltage levels is achieved by changing impedance around the loop. Impedance is a combination of the line characteristic impedance according to root (Lper_lea/Cper_len) and electrical resistance of the conductors.

Figure 16A:
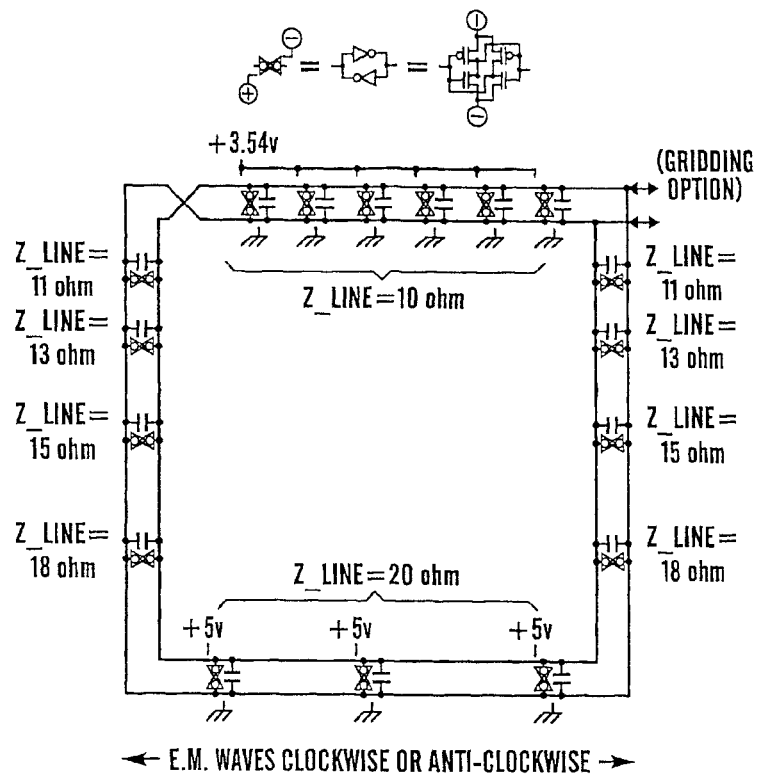

FIG. 16A shows an electrical closed loop activated to have a near-smooth variation of characteristic impedance by progressively increasing/decreasing capacitance/inductance around the line. The change in impedance must ramp up then down again so that an electromagnetic wave flows smoothly with low reflections up to the higher impedance then down to the lower impedance. Capacitance can change by using more and larger transistors in the low-impedance regions and fewer and smaller devices in the high impedance regions. In practice, high voltage transistors have lower capacitances than low voltage devices which makes this task easier. Also, the "on-resistance" of the corresponding devices match this desired impedance ratio. Additionally or alternatively, monolithic capacitors could be used. Inductance is variable adjusting the width, pitch and thickness.

Figure 16B:
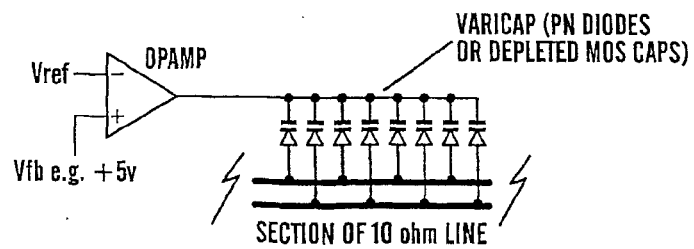

Alternatives to near-smooth progressive impedance change are available including a sudden characteristic impedance change say by insertion of transmission-line transformer in the loop. For example, to convert 5 volts down to 2.5 volt a 4:1 impedance transformation could be used, e.g. with 5 volt 40 ohm line, moving smoothly to a 2.5 volt/10 ohm line. FIG. 16 C shows examples with two possible transformer types. FIG. 16D shows impedance changes of 4:1 (2:1 voltage transformer). Other transmission-line transformers are also suitable for monolithic integration on metal-insulator-metal dielectric layers as common on VLSI.

Closed loop control over the impedance of the lines (either primary or secondary) permits output voltage regulation. Impedance is readily changed by varying capacitance, though switching of inductive elements is seen as feasible. Switched capacitors and varicaps (varactors) are seen as preferred, say PN diodes or depleted MOS capacitances. FIG. 16 B shows a closed loop circuit which adjusts the impedance of the low Z section of the line of FIG. 16A to increase or decrease the relative amount of energy taken from the 3.54 volt supply. Lower impedance by higher capacitance from the varicaps results in higher energy take-up from the 3.54 volt supply, which is when transformed up to the higher impedance by the traveling wave, and overcomes resistive losses and switching/rectification losses there to match the power being taken from the 5 volt line, so maintain regulated 5 volt using feedback around the opamp acting to change the low-Z line impedance in closed loop manner. Closed loop primary impedance can be controlled capacitively to regulate power delivered to the high impedance side of the converter. This can also be useful as a method of closed loop frequency control when coupled to a phase comparator, say for phase locked loop (PLL) frequency control.

FIG. 16C shows planar transmission line 2:1 transformer and 1:1 isolating transformer elements typically with silicon dioxide dielectric and metal layers that need not be the same as for primary and secondary conductors, all devices being bidirectional and input/output terminals arbitrary. FIG. 16D is believed to be self-explanatory for transmission line impedance conversion.

Power conversion is inherently bidirectional. In FIG. 16A, power can flow from the 5 v supply to the +3.54 v line when the latter is loaded.

Illustrations are focused on co-planar embodiments but multi-layer and multi-turn isolated metal loops can be formed on other layers of metallisation in VLSI processing. Such secondary windings can be pairs, typically open-ended at one end and shorted at the other, which in combination with the rotary oscillator underneath or above would result in a power oscillator output pair using the open-ended wires.

All options available to clock distribution networks are also available to power supply converter networks, i.e. gridding, cross-connection rules, cross-conduction elimination, frequency control, Kirchoff combination rules etc. Gridding infra-chip and also between chips in parallel synchronicity can increase the available power output of the converter. Over-coating with ferrite, whether all over or just over the transformer regions, can help increase common-mode impedance of the transformer and reduce magnetization ripple. The FIG. 16B concept can, of course, be carried over into clock distribution/generation methods when driven by a frequency or phase comparator error output. The closed-loop could then achieve exact frequency lock through the delay adjustment of the varicaps. Other variations would be to used switched capacitors driven digitally from a counter driven by "up/down" error signal from phase/frequency comparator.

Advantages of power supply conversion hereof include
- very small size, e.g. a complete 1 W converter could fit into a 2×2 mm IC.
- output voltages can be available simultaneously at many possible output voltages
- bid sectional power conversion.
- low noise using differential action with low radiated emissions
- very low ripple with switching events distributed in time and space.—square wave push-pull differential current is highly constant.—high efficiency.

VLSI layout for designing clock generator structures hereof may or may not be on a 'full-custom' basis with complete freedom of place and route. One such design route would be by way of first laying down a clock grid structure prior to place-and-route of logic elements. Another design route might be by way of first placing logic elements down and then inserting clock oscillator/distribution structures based on appropriate placement algorithms.

Suitable algorithms conclude by producing metal layout, and MOS transistor patterns as well as vies etc to meet sufficient of the following criteria applied to each route taken in view of the overall IC operation:

choosing route(s) to connect clocked nodes with desired relative mutual phasing. (This will determine the path of the interconnect and the number of branches and recombinations necessary as phase is continuous).

checking for conflict between route and space inserting cross-over(s) of the differential clock conductors when running parallel to susceptible signal trace(s) for canceling effects adding deliberate compensating capacitances (e.g. metal-insulator-metal) or inductances to cancel coupling effects using counteracting phase (see FIG. 11)

using impedance and phase velocity control L, C from metal layout adjusted using capacitor padding/track trimming) to meet:

"Kirchoff" type laws regarding energy in/out at junctions phase matching at branch expansion and recombination when multiple flow paths diverge and merge phase inversion of differential signal at some if not all circulatory paths in the network to promote oscillation (i.e. 180 degrees of phase change per loop)—Closed paths without phase inversion can be broken and inverting transmission-line transformer pattern inserted and connected substantially equal time delays around all possible closed-loop paths for coherence, low loss and waveshape quality These can be satisfied with on or off chip routes for infra- and inter-chip synchronizing. Open ended or shorted stub connections allowed by rules.

adding amplifier transistor layer patternings between control electrode and output electrode 180 degree or substantially 180 degree points to maintain oscillation and top up energy.

any negative impedance devices can be attached by a single connection to any point on the lines adding or renewing dummy capacitance to slow lines down and/or lower impedance adjusting spacing of wires to increase/decrease inductance, this impedance to lower/raise velocity (or use other geometrical variances to alter inductance as applicable). For frequency multiple coherence, conforming networks can be coupled by suitable techniques.

Figure 17A:
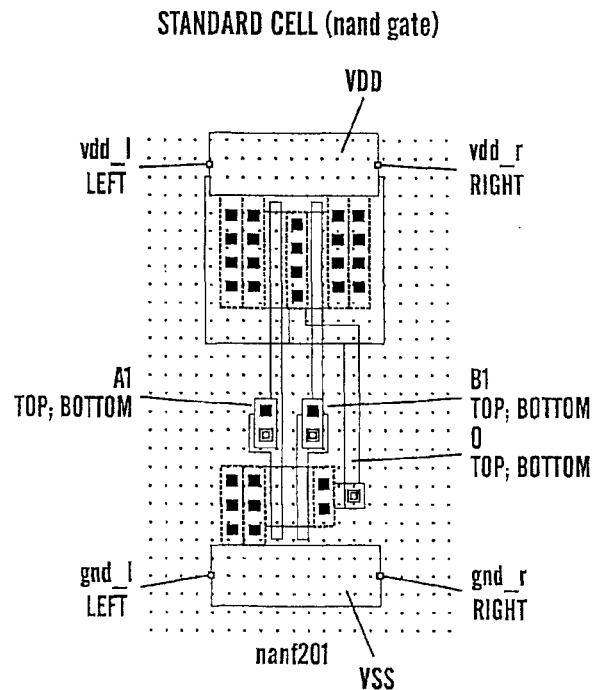
FIGS. 17a-c relate to CAD layout work.

A common VLSI design methodology is known as "standard cell", where layouts are made by placement of regular sized sub-circuits according to "floorplanning". Standard cells are often from different sources but conform to accepted height and/or width sizes and multiples. Design or parts made up of interconnected standard cells allows layout with the cells abutted and arrayed. Predefined routing paths or channels are already allocated within the cell A typical cell is shown in FIG. 17a. The cell has VDD (+supply) and a VSS (0 v) supply metal rail running horizontally at top and bottom, respectively, of the rectangular cell. Abutting such cells connects each to the common supply rails. Signal and clock interconnect between cells are usually routed over the top of the cells on the various metal layers available to planar processing.

Figure 17B:
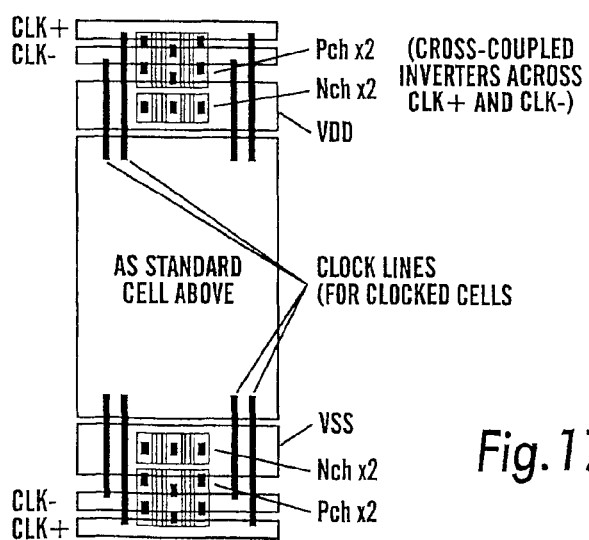

Standard cell layouts could be readily modified to incorporate compliance with relay wave clocking hereof. Such modified cell design could contain not just the components of the original cell but additional metallization and amplifier/switching transistors to produce the rotary clock function. The clock function transistors can be placed and located underneath the metal structures, see FIG. 17b (not showing connections between transistors and metal). Abutting the cells automatically forms the pair of differential signals paths to ultimately make up sides of a closed loop at the top and bottom of the cell.

Figure 17C:
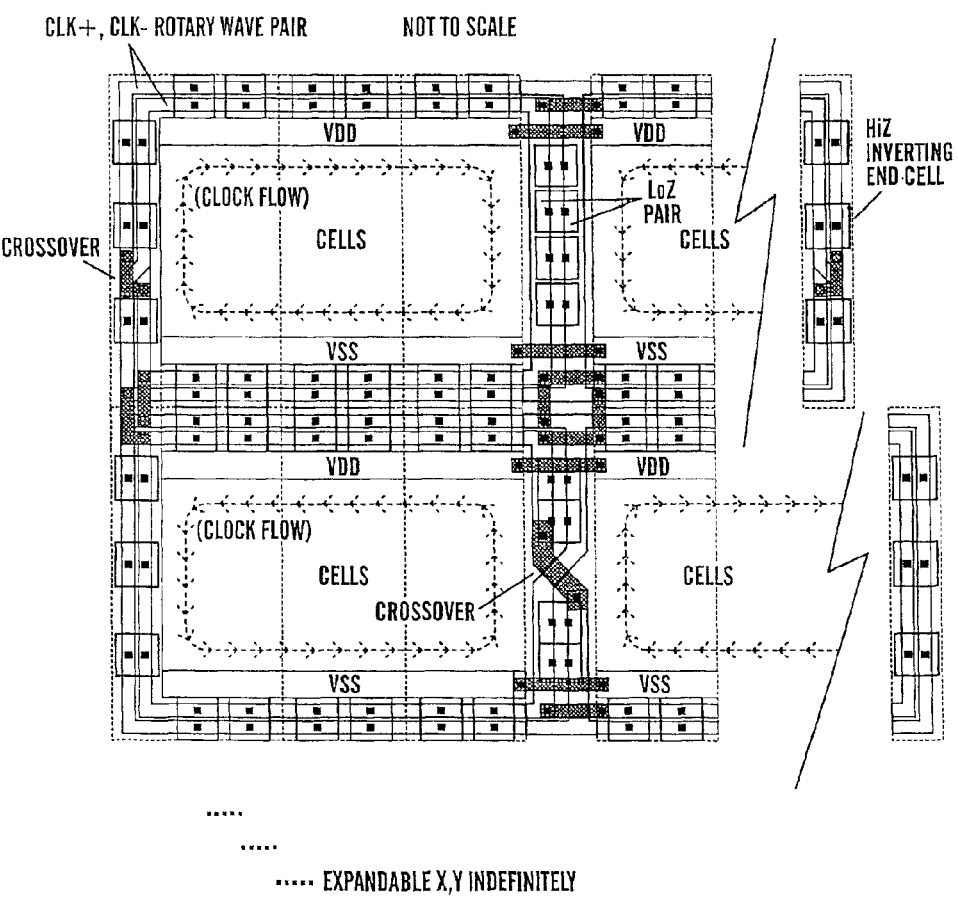

A new cell library could be generated automatically from CAD tools for existing standard cells and as developed the rotary clock requirements using internal scripting language to insert the new clock related lines and transistors into the GDS layout file. Vertical column or "end-cells" can be designed and used to close the loops. Various inverting/cross-over and non-inverting end cells are shown in FIG. 17c. Impedance of the bounding cells for the IC are half of the inner end cells in accordance to Kirchoff type laws. Cells can be designed with metal 'overhangs' to facilitate grid connection through overlap when the cells are abutted.

For non-square aspect ratio rotating wave loops, the operating frequency of the chip is determined mainly by the long/X pitch of the vertical clock connect cells. The designer or automated tool has control of this pitch parameter. Fine-tuning of operating frequency can result from re-sizing of booster amplifier transistors and other methods (capacitive or inductive) mentioned above and can be under program.

In the example of FIG. 17c, wide loops give "same-phase" vertical (Y) columns throughout the chip so that any X point has zero skew in the vertical (Y) direction. There will also be usefully low skew in adjacent columns. In the horizontal direction, phase is cyclic allowing communication interconnects directed horizontally to be launched and received at any desired phase point to correct automatically for time-of-flight (TOF) induced delays. Communication can remain synchronous even when the TOF becomes larger than one clock period. This just introduces latency.

Placement/floorplanning algorithms can shuffle the column order of cells to produce the most favorable relative phasing. Cells mid-way between vertical loop links have a full 90 degrees 4 phase clock system to work with (using upper and lower pairs). Cells either side of this position have different and potentially useful phase sets for a placement algorithm to consider.

The figures show the simplest form of gridding compatible with Standard-Cell. Variants can include full or staggered overlap of cells to merge the clock metallizations in various ways tot control impedance and eliminate duplicate traces.

Vertical clock-connect cells can be staggered in X instead of all being in regular columns, as would allow for launch and receive phase offset for vertical interconnect to account for interconnect TOF. For single phase clocking (albeit not recommended on grounds of current surging), it may be possible to interpolate between the times of wave at the top and bottom of the cell at any X coordinate.

An option somewhere between standard cell and full custom resembles the so-called sea-of-gates. Each standard cell design can be modified to be compatible, specifically expanded slightly, say maintaining existing connectivity by stretching interconnect, to leave room to place small inverter transistors at many points within the cell. Inverters are inserted throughout the cell in the spaces allowed by expansion, say to have a "spare" inverter density of (say) about 20 micron pitch. These modified standard cells can be placed as normal.

For clock generator routing, the algorithm above for the second full custom design route can be used to generate the clock line layout including transistor connection. To connect to the necessary boost/sustaining transistors, the routing algorithm now can then find the necessary inverters by connecting down with vies to the points of attachment to known locations according to placement coordinates of each device. So long as the e.g. 20 u inverter pitch is maintained, a 20 u wide clock conductor will be always near an inverter pair on its path.

Many inverters will be unused in this approach because clock lines are quite sparse, but by modem processes transistor sizes are very much smaller than interconnects so wastage of useful area should be acceptable. For "sea of gates" architecture, where regular arrays of transistors are prefabricated on a standard wafer, inverters are readily available at known positions.

Magnetic skin- and proximity effects on signal losses for VLSI metallization interconnects has been little considered to date. Indeed 'skin depth' at Mhz operating frequencies is deeper than the thin metallization layers used. Also, proximity effects have not been significant due to the relatively narrow conductive traces used and relatively large separation distances between traces.

For Multi-GHz clocking of VLSI IC's these effects need to be considered. Interconnect delays and signal quality are the main determinants of VLSI performance because intrinsic gate delays have been reduced very effectively with device scaling. Improvements in performance can come from interconnect performance improvement, and systematic methods of usefully including interconnect delays into pipeline operations.

Reductions of parasitic resistance to improve performance are usually by reverse scaling i.e. thickening and widening conductive traces, but provide little improvement at very high frequencies where current crowds to the surface and the edges of the traces due to skin and proximity effects. Two farther effects become apparent as high frequencies get higher, namely eddy current losses in wide conductors and undesirable transformer-hire mutual-inductance couplings to absorptive electrical networks.

For VLSI design, these are new issues for which there is no preparation and teaching to date. However, it is postulated here that these effects have effectively in some sense applied in other disciplines. Thus, effects like now seen in 'submicron' dimensions on VLSI interconnects at GHz frequencies should manifest themselves at MHz frequencies on millimeter diameter interconnects.

Looking at the field of magnet wires for high frequency, high power electrical machines, the whole cross-section of the transformer or motor winding wires needs to be utilized to minimize resistive losses which might otherwise cause device overheating. One proposal to eliminate skin effects is to use, instead of a large cross-section wire, an equal total cross-section area made up of much smaller individually insulated 'filament' conductors. The radius of each can be less than the expected skin depth at the operating frequency. In itself, this can eliminate eddy currents which could occur inside a single large diameter conductor, but does not prevent current crowding to the outermost filament wires of the multi-conductor bundle at high frequencies, i.e. an effective skin effect is still present—due to the magnetic coupling between free electrons in the conductors which still exists when insulation is present.

Current can be shared equally if the filaments have spiral, weave or other physical manipulations of the position of each filament, so that on average all filaments experience the same magnetic interaction as all the others. One suitable weave construction is known as "Litz wire".

It is one object of this aspect of this invention to develop such thinking for application to semiconductor integrated circuits, specifically with digital transmission lines, where there is a further requirement that the period over which magnetic balancing of all filaments needs to be achieved in substantially less than the product of propagation rise or fall time and line velocity if the current pulse is to be distributed amongst all filaments.

Planar metal-insulator-metal transmission lines used in VLSI chips can be subject to losses that increase sharply with frequency, due to the resistive effects mentioned above and not previously thought to be problematic.

It is believed that developing techniques to mitigate these effects will improve across-chip data and clock communication at 1-10 GHz that would otherwise be power inefficient and speed limited due to requirement for 'repeater' circuits at intervals. Simply widening or thickening the traces helps little, maybe makes matters worse because of increased capacitance. Replacing copper with silver as a much better conductor would only give a 10% improvement.

According to this aspect of invention, paralleled paths of current carrying conductors are arranged to reduce inductance differences between connecting or intersection positions.

The rationale is towards substantial to equality the current density in all high frequency traces independent of operating frequency. For DC and low frequency (<100 MHz for VLSI) cases, electric currents seek "paths of least resistance". Paths all offering the same or equal resistance, including parts of a conductor cross section would experience equal current densities. At moderate frequencies (~100 MHz), due to proximity effects, current crowding can occur between adjacent faces of conductors carrying current in opposite directions in this effect is not further increased with increased frequency.

At high frequencies, current tends to follow 'paths of least inductance, i.e. as producing minimum stored magnetic fields. At frequencies in excess of 1 Ghz, skin effect begins to dominate even for thin (2 u) metal. High frequency current distribution becomes more in line with low frequency conductor utilization where the paralleled paths of current-carrying conductors are arranged to have substantially equal 'partial inductance values between communing or intersection points. This requires can be achieved by use of galvanically isolated multiple filaments that are separated to avoid eddy-current type losses which would arise from different induced voltages in close neighboring filaments experiencing different magnetic field intensities.

Figure 18A:
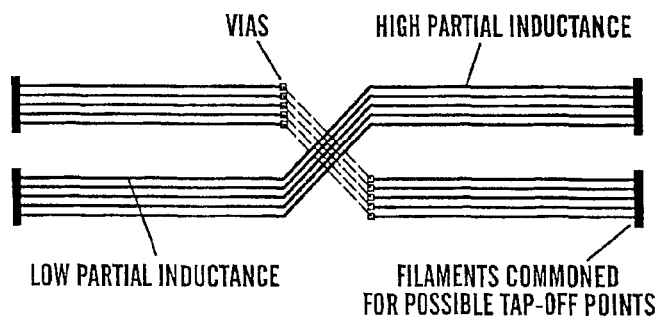
FIGS. 18a-f concern dealing with skin, eddy and proximity effects.

FIG. 18A shows how a differential line segment with a crossover can be compensated for eddy and proximity effects. What would otherwise be two wide tracks are each broken into distinct multifilaments before being recombined at commoning points. Due to the crossover, for all segments there is a part of higher partial inductance and a part of lower partial inductance. The series inductance of each path between the commoning points is made about equal for all filaments, thus prevents current crowding to the inner edges as would normally occur.

Commoning of the filaments, such as to tap off a signal (e.g. clock) or combine with other networks, can be arranged at intervals and positions where and between which the partial inductance of all parallel filaments concerned are substantially equal else current will concentrate more through the lower-partial inductance paths and waste potential benefit of the full total available cross-section.

Figure 18B:
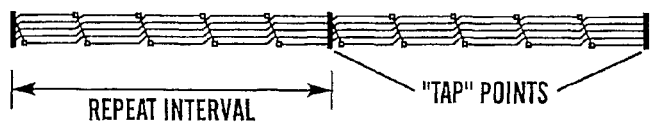

For single-ended systems, FIG. 18B is an example of isolated, mainly co-parallel filaments jogged periodically using crossunders to make the effective electromagnetic experience the same for all filaments over a certain length and periods of that length. This wire is largely immune to proximity and eddy effects for wavelengths longer than the repeat interval.

Figure 18C:
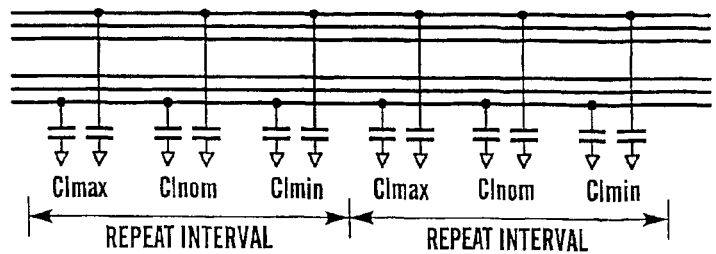

FIG. 18C is another approach to equalizing the current density of the wires by loading each wire with capacitance, conveniently loading up higher inductance tracks to raise the current density close to that in lower inductance tracks, and achieving load and current balancing amongst filaments.

Figure 18D:
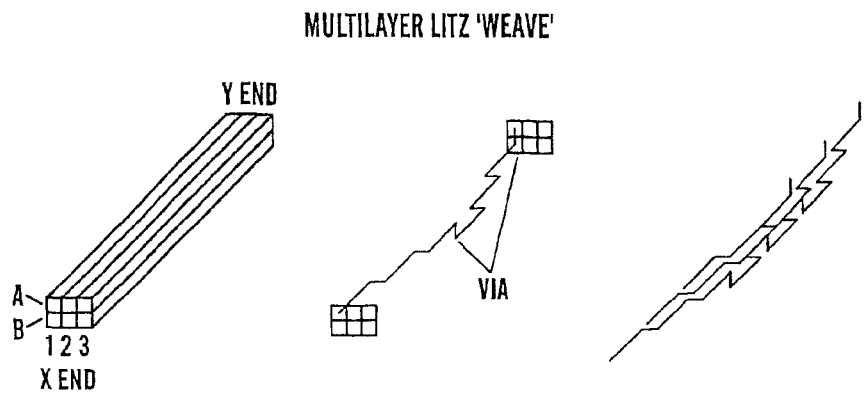

Extending the segmentation of the conductors to multilayer filaments can be desirable, otherwise a thick single layer metallization could only be used efficiently at lower frequency. Each conductive layer would typically be isolated by a thin' layer of glass or polymer insulation. FIG. 18D shows how insulated multilayers and vias permit each filament to 'wander-around' various up to all cross section positions in the direction of current flow. This substantially equalizes each wire magnetically and achieves substantially even current sharing. An artificial weave is formed that is not dissimilar to Litz wire. Exemplary indication is for a 2×3 multilayer multifilament matrix that would have high skin, proximity and eddy loss; Litz-like path including a via; and three of likely six Litz-like paths also including vias—as substitute for plain strip in any application.

Single-ended and differential transmission line structures can be formed using this construction instead of straightforward thick wide strips in any application to achieve low losses at high frequency. Unlike the previous known structures, this has the ability to fully eliminate skin-effects of thick metal traces.

Figure 18E:
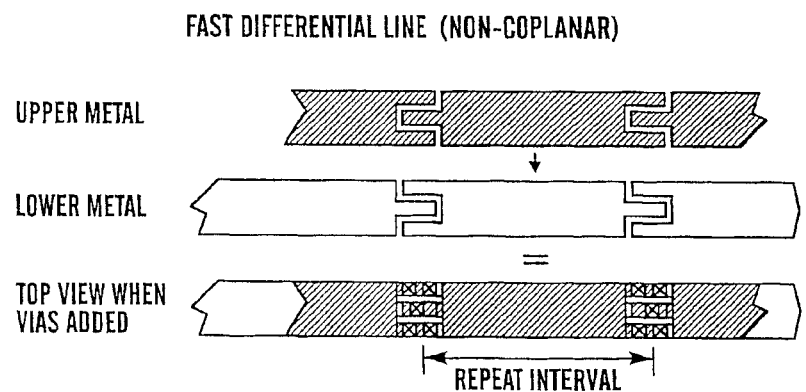
Figure 18F:
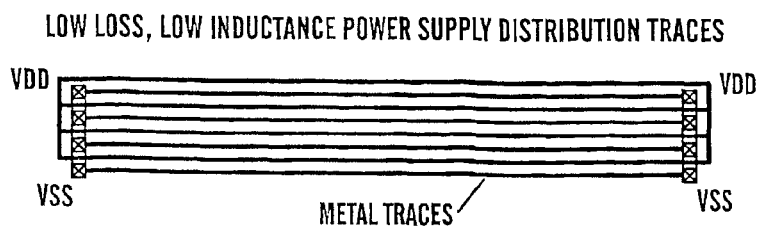

FIG. 18E shows a high C, low L non co-planar differential transmission line. Upper metal layer is shown above lower metal layer along with a top view with vias added. Intermetal dielectric is not shown. If wide enough, implementation could be as a differential clock plane. FIG. 18F shows a low-skin loss, low inductance, high capacitance, low-Z power feed which can be extended to a multilayer implementation with VDD and VSS alternating in the Z direction as well as the Y as shown.

The measures of this aspect of invention aim to mitigate skin, eddy and proximity effects in such ways that significant changes to VLSI manufacturing methods are not required, but even long range interconnect signals can reach further, require less energy input and operate faster than simple strip line arrangements. The proposed metal patterns are readily formed lithographically in substantially normal ways.

Synchronous parallel electrical data buses have long been used, including on-chip, for moving data in convenient byte (8 bit), word (16 bit) and larger or other bit-widths in mainframe computers, PC microprocessors and other data processing applications. Examples include PC/AT bus, PCI bus, FutureBus, etc.

At low data rates and over short physical paths, simple data buses can be treated as essentially instantaneous communication channels for electrical signals. This applies whenever the signal transmission time is much shorter than the clock period. With the recent dramatic rise in data transmission rates into MHz and now envisaged on to GHz, this treatment is no longer true, and full electromagnetic transmission line analysis is becoming required to design a functional data bus. When such issues as magnetic, capacitive coupling and resistance are considered, special measures are required to limit crosstalk, reflection and attenuation. Problems get worse as dimensions get smaller, as is consistent with VLSI scaling practices for higher performance. Many methods of individually addressing the above limitations are known but usually increase power consumption and/or physical area usage, and/or require complex and inefficient data precompensation methods plus clock recovery and PLL circuits. Extra expense is incurred, but parallel data busses remain an order of magnitude lower in performance pin-for-pin than serial data links, i.e. in terms of Bits/Sec per pin for the same process technology. At this time, large physical separation between co-parallel conductors, or dedicated ground planes, tend to be used to limit signal crosstalk and. provide good impedance control in miniaturized multiconductor transmission line buses.

It is the object of this aspect of invention to produce a system less subject to such performance limitations.

According to this aspect of invention a simultaneous two-way synchronous data transfer bus, preferably in association with two physically separated but coherently synchronous two-phase clocks to control transmission and reception bits, has one or more of the following further provisions for compensating for induced crosstalk at source, conveniently by current injection, to reduce preferably negate need for physical separation of conductors using receive signal conductors and transmission return-current lines during transmit, thus avoiding need for separate ground traces.

accommodating signal attenuation, including frequency dependent attenuation, by allowing half-cycle pulses to decay between cycles so that there is no memory of previous bit values (as common in NRZ signaling format)

multiphase transmission to avoid ground bounce problems including to where only one line is switching at any one time.

accommodating high losses thus helping to isolate return reflections (normally considered problematic).

Individual conductors can be formed from multifilaments as in last preceding instance aspect concerning planar 'Litz-like' wire braiding/multilayering, or be as other conductor structures mentioned before.

FIG. 19 is generally concerned with array and matrix synchronous input/output. FIG. 19A is a cross section of a typical 5-metal VLSI process showing lowest-loss upper metal layers having a high height/width aspect ratio. Such on-chip VLSI interconnects are effectively highly lossy transmission lines. Because of the freedom given to Place-and-Route CAD software, the exact patterns of most lower layers of interconnect will be unknown and must be treated as random.

At design-time, using coplanar strips as preferred for the top metal layer (but usable for other layers too), the system will have a known loss figure for traveling electrical signal components. This loss figure will increase with frequency, due to skin and proximity effects, and is principally due to resistance in the interconnect metal.

The five top layer traces shown in FIG. 19A form a Multiconductor-Transmission line (MTL) characteristics of which are well studied and usually require a matched matrix of terminations. As now proposed, specific terminations can be avoided.

FIGS. 19B, C are circuit diagrams for basic drives, one (B) a bias voltage generator, the other (C) a push-pull current source controlled digitally. The latter can output a positive current (*D1=low), an identical negative current (D0=high), or no current (*D1=high, D0=low). It is assumed that the characteristics of the Nch and Pch devices are identical which is not essential, but does simplify this description. When this subcircuit is called-up for layout on-chip, the parameter wx sets the transistor widths on the layout The drive current scales proportionally to the MOS transistor channel width. Effective output resistance is high, effective capacitance is low.

FIG. 19D shows a compensating array element hereof as a useful building block for driving the multiconductor VLSI transmission lines. The aim is to dispense with the need to use alternate signal and ground lines in the multiconductor line. Each wire then carries a useful signal so halving the area occupied by the bus. In operation, any signal current driven to a signal line from Q is to be matched by forced currents in the two neighboring wires via outputs Y and X.

Figure 19F:
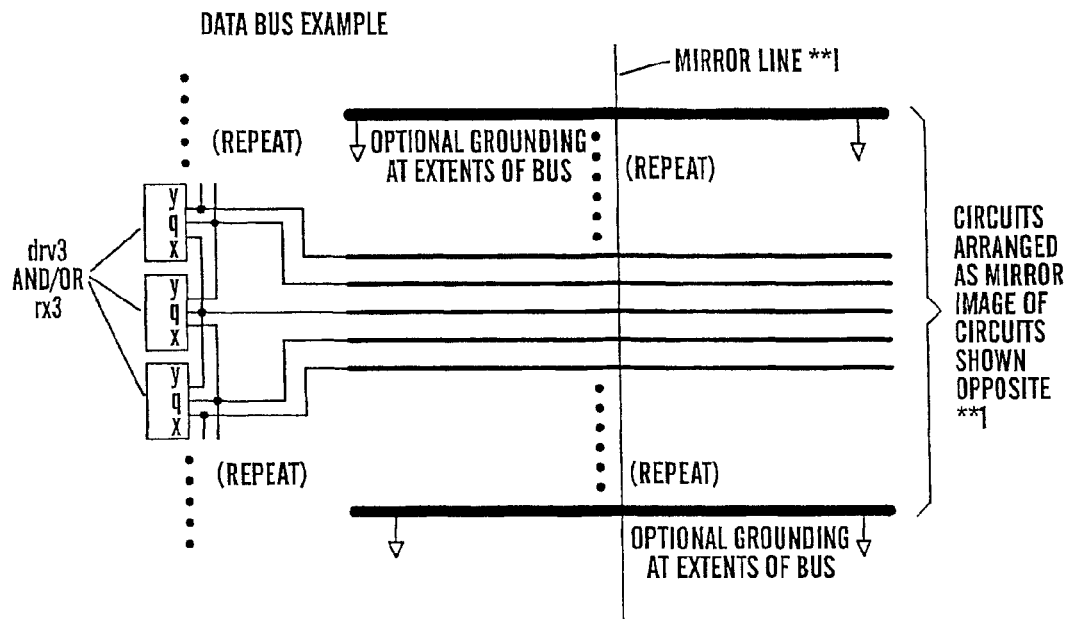

When the subcircuit drv3 is used, the parameter scl would be 0.5 if there were no other signal return current paths except the neighboring conductors (as is case in FIG. 19A). In practice, scl value of 0.4 would suit where 40% of the signal current returns on each of the adjacent conductors and 20% finds alternative current paths (making 100% in total). Such return current flow through the adjacent conductors will usually suffice, but the principle hereof can be extended to other near-neighbors whose coupling to the driven lines is also non zero (see matrix later). At ultra-high frequencies the return currents follow the path of least inductance making the adjacent conductors the dominant path. FIG. 19F illustrates how these drivers are arrayed to drive multiconductor bus.

FIG. 19E shows a pseudo-differential signal reception through the measurement of signals relative to the median value of the adjacent two conductors. Resistive summation is shown but capacitive is possible. There will be one circuit per bus conductor.

A conceptual differential comparator is shown which might be realized using many alternative known techniques e.g. the receive circuit might be self-adjusting in that it nulls itself to the signal voltage at the end of the transmit phase to compare with the signal arriving at the receive phase say using switched capacitor sample/hold. In this way DC offsets and data-dependent lowpass characteristics are accommodated. This could allow two-bits per clock cycle. However, typical "one-bit transmit/one-bit receive" two phase operation is described.

When the resistance is high, and capacitance is low, the termination produces an apparent doubling of the received signal due to the sum of same-phase incoming and reflected waves.

The inherent lossy nature of VLSI interconnect means that the new scheme hereof can dispense with complex termination requirements, so long as the loss is deliberately high. In fact this will always be the case, because short-distance low loss signaling is already well served by CMOS signal interconnect Reflections only cause a problem when they get back to the transmission-end in the two-phase signaling systems outlined previously. Even 100% reflection coefficient (perfect mis-match) is acceptable providing the one-way loss is around 6 dB-12 dB (0.5×–0.25× gain), meaning the 2-way loss will be 12 dB-24 dB (0.25×–0.0625 gain.

Therefore bus termination during the reception phase is not a perfect match and reflections will occur. The 2-way round-trip loss is high enough for the reflections to make up only a small part of the signals. Any receive-time reflection at one end manifests itself as an incident signal during the next transmission phase at the other-end—it does not directly affect the signal reception phase at that end and in reflecting from the transmit end adds to the intended transmit signal. In the worst case where 100% reflection occurs, the transmit signal normalized to value 1 will have an addition of +/−0.25 (for 6 dB per direction loss) depending on the polarity of the received signal and the nature of the reflection. In principle, knowing the type of reflection (open-circuit or short circuit) would allow the transmitter to adjust it's current drive output in accordance to the expected return signal.

Figure 19G:
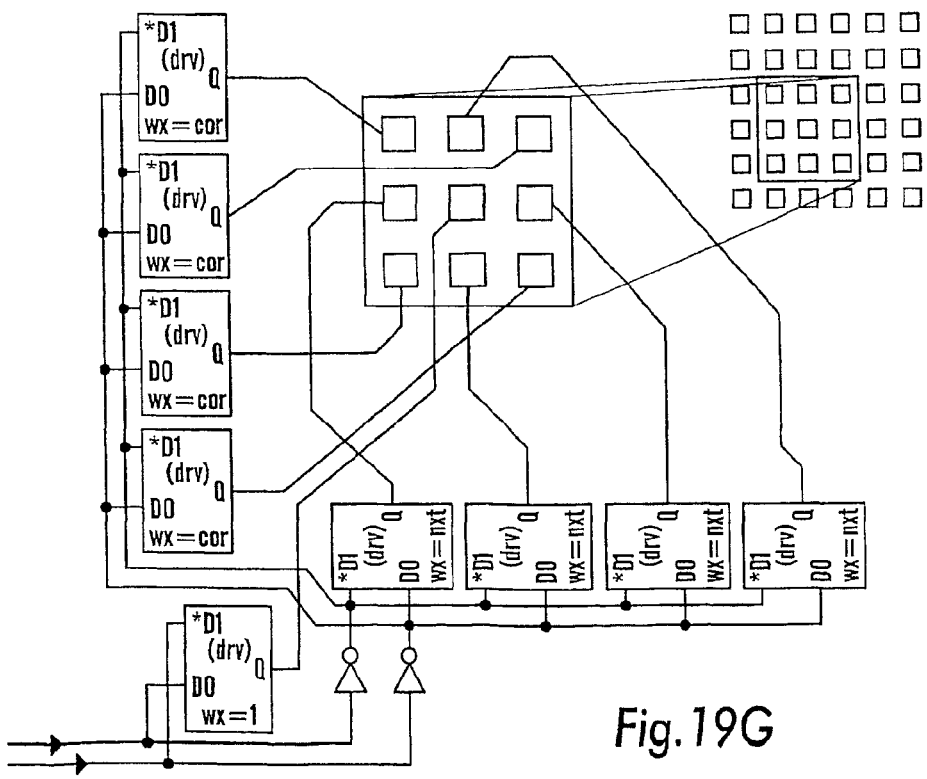

Buses as described here may be stacked one above another on a multilayer PCB or VLSI process to increase the number of data bits. This might also have applications to connectors with X/Y grid pins. FIG. 19G is a generic 2D matrix case where compensation for a single pin's current drive involves scaling and steering the injected return currents in proportion to the electromagnetic-defined spread of currents of the structure. For a single pin, eight return-current generators are needed. The four adjacent drives are stronger (nxt=−0.15) than the corner currents (cor=−0.1). One pin driver is shown and nine instances of FIG. 19D are required per pin.

Though often neglected in VLSI design, it is fact that all circuit currents flow in loops in the quasistatic case. A return path for any signal current must exist At very high frequencies, current loops follow the path of least inductance. At GHz frequencies, current doesn't even fully penetrate a 2 micron wire. When a correctly defined minimum inductance current path for the go and return lines is defined for a transmission line, current will flow through this path in preference to other possible current paths which might exist. The contained current flows at GHz frequencies in proper transmission lines, minimize the current loop area and consequent magnetic field generation. This greatly reduces crosstalk problems common in the high Mhz band of operation.

Counter-intuitively, this makes GHz interconnect design easier than 100+ Mhz interconnect design because in the latter, current still tends to favor the path of least resistance and an enormous number of possible resistive paths are available on a multilayer VLSI chip with essentially random (uncontrolled location) interconnect patterns (due to router algorithm complexity).

Operating with only the GHz frequency components of a signal waveform can be achieved either by generation of GHz only components in the transmitters and/or making receiver circuits only sensitive to this frequency spectrum. Features include extremely high speed, 2 bits transferred per wire per clock cycle, low power, low capacitance, no precompensation needed as in NRZ, quasi-differential contained fields.

One unusual property of the bus is that it is not DC terminated to a particular ground level on either side, so can be DC biased differently on either side so long as the voltages are within the supply voltage range and common mode range of the current sources on each side. Also, as a group of signals, the bus gets net positive or negative current into it and every positive current is balanced by a pair of 0.5× negative currents and vice versa. Multiple light termination of each pin of the bus, and of either end to a convenient bias voltage, will set the quiescent voltage.

Each line (or pair—see below) of the bus can be phased slightly different from its neighbor, as what can reduce current surging (ground/supply bounce). Also, the transmit (Ix) and receive (Rx) phases of alternate lines can and should be alternated in this new drive arrangement so that all odd numbered lines [both ends for duplex] are driven during one clock phase with even numbered lines receiving [both ends for duplex]. In the other phase, all even numbered lines are driven [both ends for duplex], with odd numbered receiving [both ends for duplex]. Alternate TX/RX/TX. ordering always gives a proper return current path for an outgoing signal without needing the interspaced ground lines or an external ground plane.

It is possible by adding XNOR logic to reduce power. Whenever two output signals spaced two conductors apart on the bus switch in opposite directions, there will be no net current induced on the in-between trace and so the otherwise equal and opposite injected currents can be turned off when the XNOR of the two drive traces=1.

Whilst the system has been described as having no essential requirement for grounding traces, grounding is an available option and can be beneficial to provide signal/noise improvement or EMI reduction or can be applied at the extents of bus strips etc.

Systems hereof are advantageous in relation to electrical crosstalk, frequency dependent attenuation, reflections and timing uncertainty (skew). In principle a may be that such multiconductor parallel data bus can function as fast (on a per-pin basic) as an individual serial data link once the timing and signal integrity issues are solved.

In FIG. 20A frequency control uses a varactor comprising N-channel mosfet transistors N3, N4 as a rotary traveling wave oscillator subcircuit N- and P-channel mosfet transistors N1. N2 and P1 P2 form the back-back inverters shown between loop traces of a small section of transmission line. N3 and N4 act as voltage controllable (Vt) differential capacitors formed. R1 is a high resistance to avoid AC load on the transmission-line. The rotary clock can be a string of such transmission line segments connected in a closed-loop with at least one cross-over (not shown). In operation, the differential capacitance formed by series connection N3, N4 is dynamic as mosfet action, hence capacitance, switches off at a voltage determined by the control voltage (Vt). In a typical case, N3,N4 area=N1 area, and a 7% tuning range results, which is sufficient to adjust typical initial tolerances of operating frequency due to manufacturing variability of silicon chips.

Oscillation frequency has a weak voltage dependence. Voltage dependent capacitance couples supply voltage changes to time-of-flight changes on the transmission-line, thus phase and frequency variation. Unlike a conventional oscillator, disturbances are the average of all disturbances over the total path length over which the pulses travel. Small localized supply noise events make little difference and produce little jitter.

Many voltage (and temperature) compensation schemes can be applied. Preference is for multiple small-size compensators distributed around the structure, generally in line with distributed traveling wave structure and operation. Voltage compensator element(s) added between the transmission line traces, or from each to AC ground, serve(s) to cancel net change of capacitance with supply voltage for the active drive and other connected elements, by an equal and opposite change of capacitance of the compensator element(s).

FIG. 20B shows normal and compensating capacitances C_norm, and C comp, tc being the temperature coefficient of capacitance and vc being the voltage coefficient of capacitance. In FIG. 208(1), C norm is made up of many component capacitances, but is, when properly differential, effectively a line-line capacitance with an overall temperature and voltage coefficient, the voltage being the supply voltage to the mosfets and the achieved p-p voltage usually being close to the supply voltage. FIG. 20B(2) shows a pair of simple diffusion diodes as readily made in bulk CMOS processing, and drawn to show capacitance variability. For bulk and semiconductor-on-insulator processes, varicaps can' also be created using MOS capacitor structures (much as for FIG. 20A).

Temperature drift is very small. First-order compensation of temperature is possible along similar lines to voltage compensation. A temperature-sensitive capacitance can be added between the lines, or between each line and AC ground, with a coefficient and size product which negates the size and coefficient of the other temperature sensitive capacitances. Temperature and voltage dependence of inductance components can also be compensated if not operationally negligible, say also via capacitance as both L and C work equally to set the frequency.

Deliberate impedance variations of the transmission line structure can improve the capability to drive a lumped capacitive load as typical of current synchronous machines. Until VLSI technology, including VLSI CAD layout systems, implements multi-phase logic better, largest consumer demand may well be for single-phase and two-phase clocking systems. Single phase systems have a heavy capacitive loading effectively at one position on each loop. It is now proposed to modify the transmission line path by altering impedance in specific proximity to positions of heavy capacitive loading.

Figure 21A:
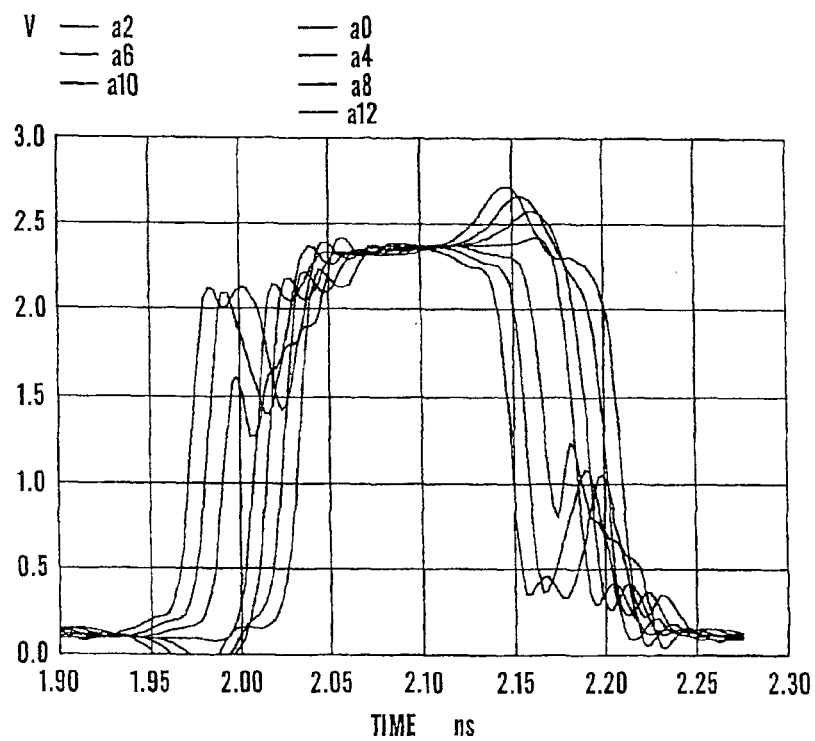
FIGS. 21a-c concern heavy top-off loading.

Rotary waves can experience reflections at impedance irregularities, and this is the basis of correction for disruption of signal waveform caused by a lumped tap load. As an example, a Spice simulation was performed for a ring with a multi-pF single point load compensated by reduction of capacitance around 90 degree or half a lap further round the loop, which it is convenient to call the Low-C or High-L point. Additive "in-phase" reflections from the Low-C/High-L point travel back towards the High-C tap-load point and help to compensate for the anti-phase reflections there. FIG. 21a illustrates waveforms at and immediately proximate the high capacitance tap position on a 40 point loop. The a6 waveform is reasonably square without too much distortion even for heavy capacitive loading. It is clear that waveforms at the tap points nearby are heavily distorted. This is not important if a6 is the only tap point.

One view of this is that reflections can help to produce desirable waveforms at some usable point(s) of the network but compromises signals at other thus unusable parts of the transmission line. Another concerns impedance change along the transmission line (gradual change is possible) with a low impedance deliberately located where heaviest capacitive loading is located.

Figure 21B:
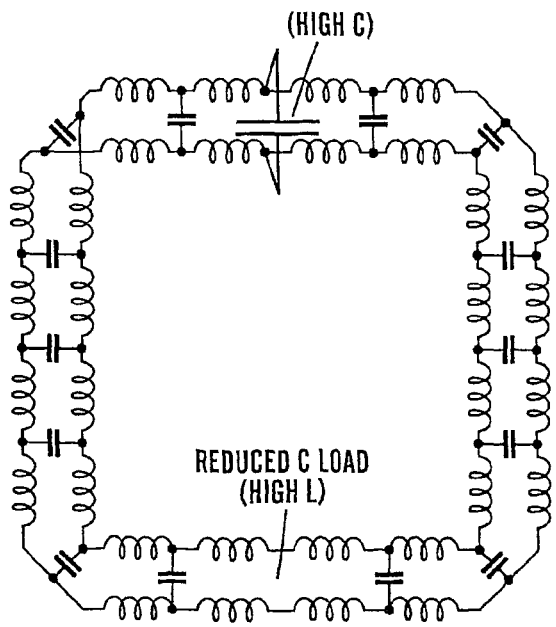
Figure 21C:
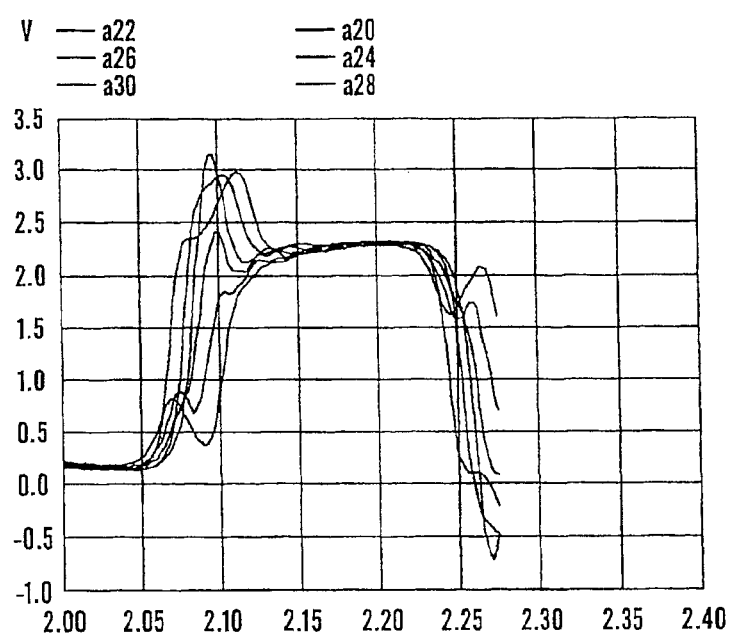

FIG. 21B shows 16 segment rotary wave loop, and FIG. 21c shows waveforms of a 40 point loop at the 90 degree electrical point away from a lumped capacitance.

It has been noted during simulations that start-up of large arrays of synchronous interconnected oscillator loops stabilizes quicker when the interconnection links have a 'lossy characteristic. No coupling method is completely lossless, and in practice, sufficient resistance is often provided by the interconnect resistance of metal wiring between rings. However, more lossy couplings between transmission line segments are possible, e.g. using lossy capacitors, inductors, or field couplings. It is worth noting that losses only occur when the rings are operating out-of-phase. At phase coherence there is little or no difference in the signals at either side of the lossy coupler connections, hence negligible unwanted losses. Accordingly, such mechanism to remove energy for the system only when it is not operating at coherence resembles a minimum-energy equilibrium dissipation technique as in other areas of physics. Very low loss direct couplings might in theory induce stable operating modes which are not 'cogged! coherent rotary waves but which still may be useful operating modes.

Semiconductor-on-silicon, specifically silicon-on-insulator (SOI) is a well known method of fabricating planar microelectronic structures which are free of many parasitic effects that limit performance on standard diffused or epitaxial silicon structures (Bulk Silicon). CMOS devices fabricated by SOI processing have very small parasitic drain and source capacitances since only a dielectric, not a depletion capacitance exists on the insulated wafer. Elimination of these parasitics can improve performance by up to 30% in some cases, and reduce power consumption slightly. FIG. 22A illustrates the difference in equivalent circuit between SOI and bulk CMOS Nch device (Pch is similar).

SOI can afford advantages for implementation circuitry hereof Whilst basic action hereof effectively takes up stray capacitance, there may be a resistive series or parallel component which limits adiabatic energy recycling, and such will be reduced by using SOI techniques.

FIG. 22B shows a switched inverter using SOI to enable efficient switch-in of "active capacitance" to adjust rotation period. Switching in and out active inverter elements can be a superior solution to simple capacitive switching. The inverters also compensate for attendant reduction of line impedance with a contribution to the rotary wave. The switchable inverter of FIG. 22B can be substituted for any or all, or be additional to, the usual inverters connecting between the transmission-lines of the oscillation loop. The transistor sizes can also be binary weighted so switching can digitally select a slow-down value. When the switched inverter is activated, it increases the effective capacitance, and reduces the frequency.

FIG. 22C shows switched transmission lines as/or a "test" feature. Oscillation performance and power economy arise from endless recycling paths for rotating electromagnetic energy in transmission line structures. In some instances, it may be advantageous to 'break the loop' with a control signal, e.g. to support injection of a low speed conventional "test" signal which otherwise cannot override the circulating energy waves. This can be done by a switching element in the otherwise closed electromagnetic loop. For rotary wave operation, it must pass energy or induce duplicate energy flow, with low loss and square-wave pulse fidelity. Predominantly resistive, inductive and capacitive devices are all suitable as are free space or enclosed electromagnetic structures. FIG. 22C shows insertion of a switching element into a transmission-line. R_gate is used effectively to decouple the gate capacitance from AC ground at high frequencies and reduce power consumption. It is possible to use a small size Pch device or current source as a substitute for Rate. FIG. 22D shows that capacitive coupling still effectively closes the endless electromagnetic signal propagation path.

For a switched Mosfet, both "On" resistance and "On" capacitance related to drain-gate-source contribute to the quality of coupling. With SOI, low resistances and large coupling capacitances can be achieved without incurring an unsatisfactory loss mechanism to a common substrate.

Standard approaches to frequency control are multiplication of a lower frequency and division of a higher frequency. Harmonic locking has been described for oscillation action hereof However, it has been proposed (H Wang Proc TEE February 2000) to make a 16.8 GHz frequency divider using 0.25 u CMOS technology. Any ratio can be obtained by cascading/2 sections and decoding. Generating and distributing such a high frequency at low power is readily done using oscillation action hereof, even if the final use frequency is many times lower than this. Advantage of low skew is obtained by using the higher reference frequency. Skew and jitter could be at a fraction of the smaller time period of the high speed clock.

Figure 23:
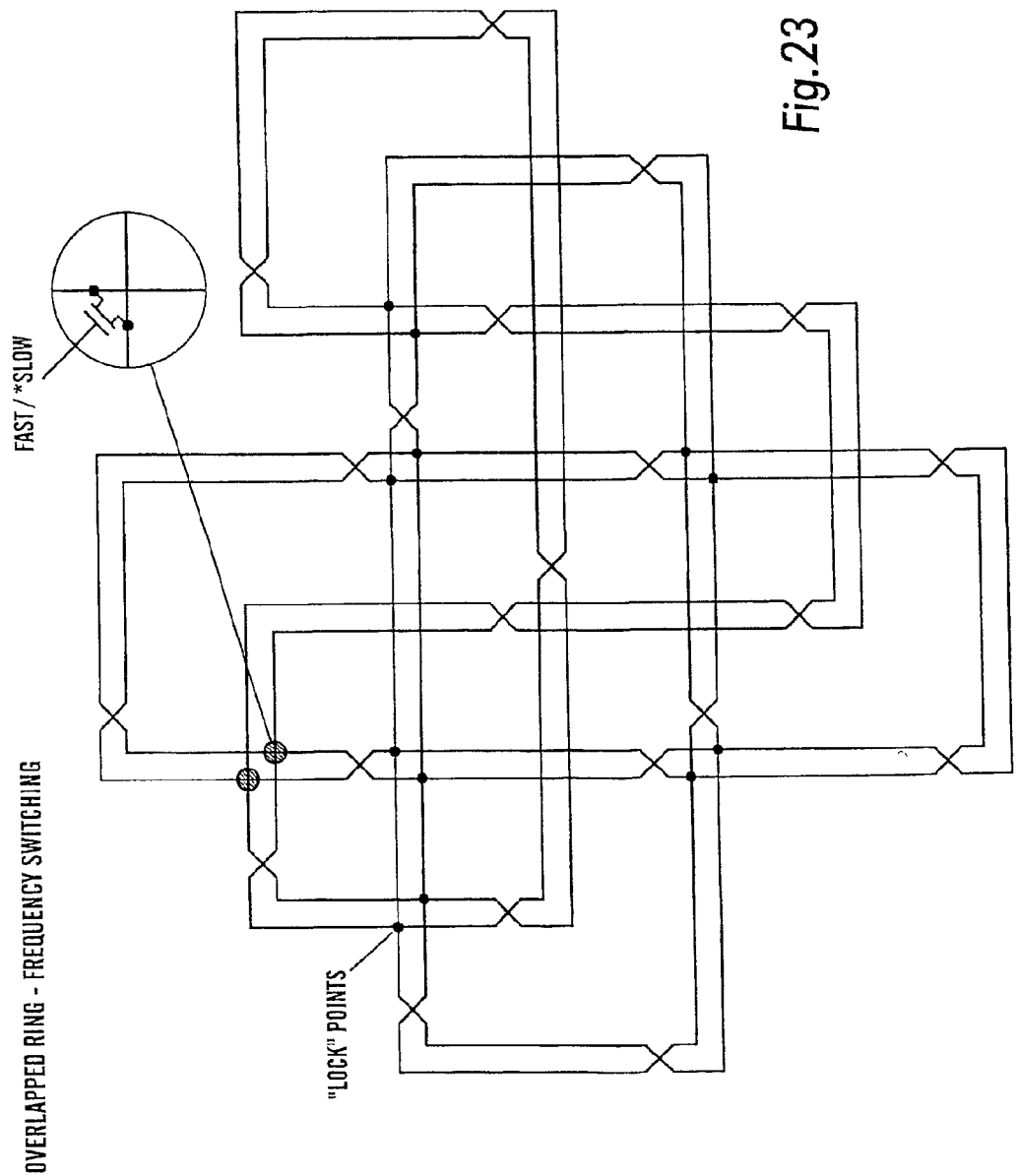
FIG. 23 concerns frequency switching.

FIG. 23 concerns implementation hereof which can produce a 4:1 frequency variation without divide-by counters, or losing low power features. FIG. 23 shows upper and lower configurations of linked transmission line loops. On a VLSI chip the wiring can be largely coplanar with crossunders to isolate the sections. With FAST/*SLOW signal at 0 v, all rings function at a low frequency where pulses must traverse two rotations as applies to all the rings. With FAST/*SLOW high, the structure becomes that of an array of ¼ length rings and hence 4:1 speed increase. The inset showing Nch mosfet device can be extended to implement a "crossover" function (DPDT instead of the SPDT depicted) to aid rotation and minimize the number of non-inverting loops as allowed in small numbers in the RTWO network. This rationale can be extended further to 16:1 etc.

Figure 24:
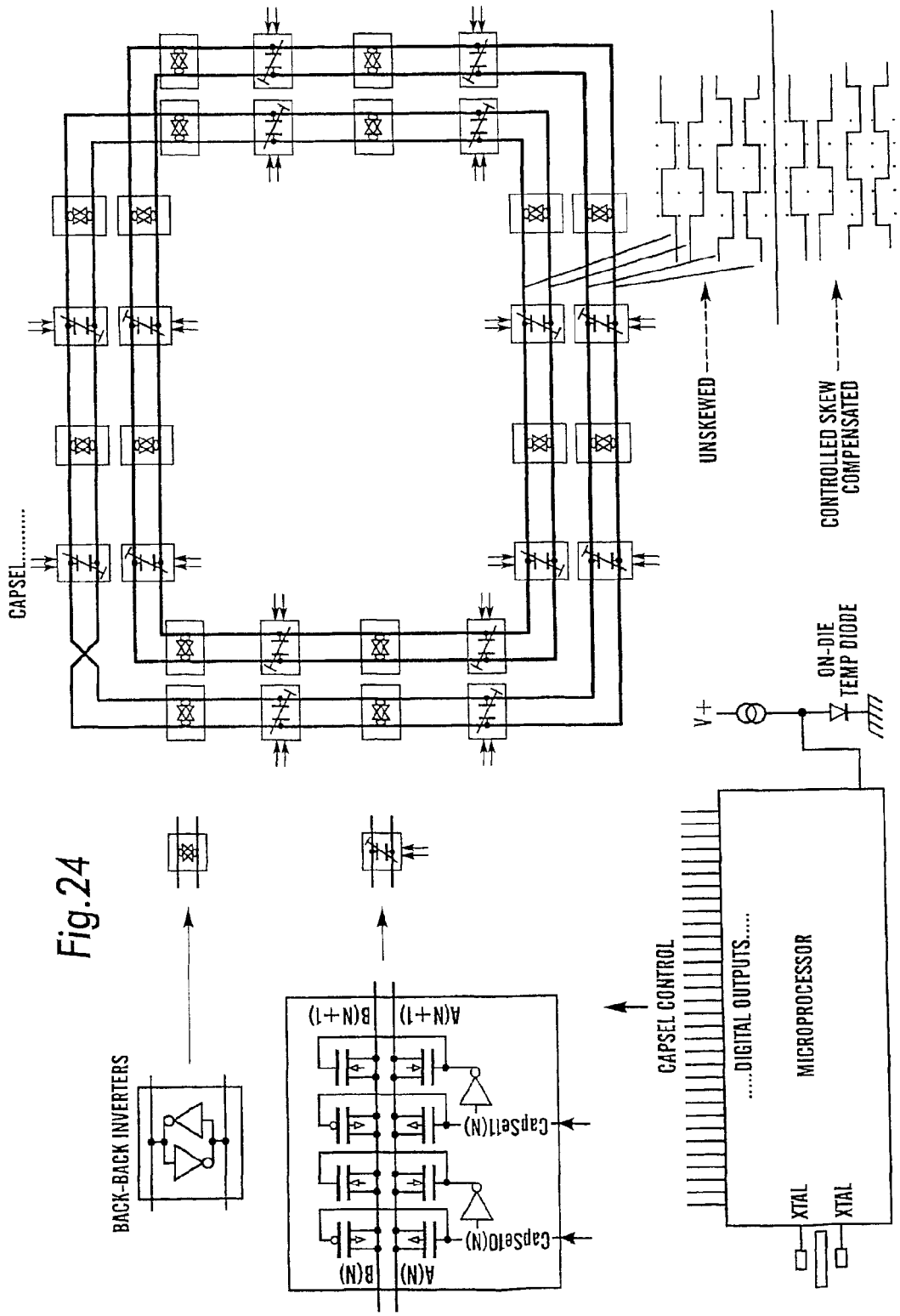
FIG. 24 concerns phase adjustment for such as four-phase clocking of domino logic.

FIG. 24 concerns skew control by manipulating selectable line capacitances (Capsel), specifically use for dynamic phase adjustment to achieve temperature compensation control based on for 4-phase domino logic as highest speeds of operation may require. Such method and means can be applied for any other reason to modulate phase control to suit any logic family, or other action, not just domino, and not just temperature compensation.

A microprocessor monitoring of on-die temperature results in output control signals to select distributed switchable capacitor elements in adjustment of local phase velocity, hence phasing of 4-phases clocking. Parallel digital output and reception is show for the CAPSEL bits, though serial output is possible using multiple 2-bit serial receivers at each switched capacitance node, say making up one large shift register and minimizing the wiring required. Control programming can deal with any desired compensation algorithm. Pulse diagrams show unskewed and modified phase timings.

Figure 25A:
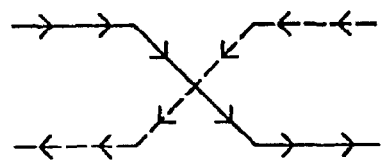
FIGS. 25a-c concern frequency adjustment according to inductance and ways to increase inductance.
Figure 25B:
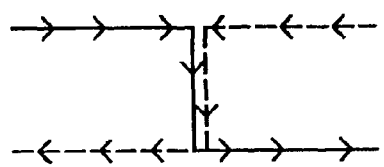
Figure 25C:
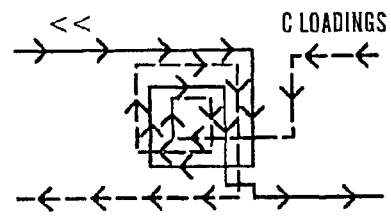

FIG. 25 is concerned with mutual coupling of differential line (loop) component conductors hereof, shown in full and dashed lines in fragments of FIG. 25; and related inductance effects, including advantageous variations and use thereof. Co-parallel extents (115A, B) of such component conductors have low mutual coupling thus low differential inductance. For a cross-over 119, FIGS. 25A, B show low differential inductance from mutual coupling (25A) that is low by reason of conductor parts 119A, B crossing steeply, shown substantially at right angles to minimize; and higher differential inductance mutual coupling (25B) that is greater by reason of localized proximate passage, shown as side-by-side traverse of conductor components 119X, Y to actual crossing (or away from it if preferred). FIG. 25C shows much higher inductance enhancement by use of spirals 119S, T advantageously in particularly effective related geometries to maximize the required differential line action using inter-mingled opposite turning (clockwise/anticlockwise) spiral formations that have additively same current-direction part- and full-turn proximities. Indeed, two full proximated turns are shown for each spiral, and there might be more if the semiconductor process allows.

The FIG. 25C structure can be used in a differential timing loop hereof repeatingly as many times as desired up to the maximum that can be accommodated and processed. The more repeats, the higher the inductance of the loop, which will have two effects, namely lowering the traveling wave loop traverse velocity, thus the frequency of any particular size of clock/timing loop; but also lowering power consumption as increasing inductance also increases impedance. The fundamental substantial equivalence of operation, as between smoothly distributed and plurally lumped L and C values, would, of course, apply.

Other uses of differential inductance provisions include matching between parts of an intendendly coherent timing/clock network with a high multiplicity of loops hereof.

An alternative to FIG. 25C would be to form single spirals discretely in each of the differential line component conductors, say in alternating pairs appearing sequentially rather than maximally proximated by superposition. The spirals of such successive repeating pairs would have turn directions that are opposite for the component conductors concerned, i.e. clockwise for one and anticlockwise for the other. The inductance increasing effect would be less than for FIG. 25C, but may well be sufficient for many applications.

Foreseen advantages include facilitating application of timing loop systems hereof to VLSI chips below about 3 GHz, even as low as 1 GHz or less, it being a remarkable feature of embodiments of this invention that implementation gets easier the higher the frequency, and the adiabatic energy recycling feature could be attractive, perhaps especially along with inherently better skew control and/or simpler modular structure compared with H-trees.

Saving/conservation of power can be a major concern for apparatus I systems using VLSI chips, whether in relation to maximizing battery life or for other reasons. Provisions for low power modes of operation are commonplace. Conventional H-tree style clock provisions tend to be power-hungry, certainly a significant to major user of power in VLSI chips, and power saving measures often extend to suspending operation of the clock in so-called "sleep" modes for at least parts of microprocessors etc. Such stopping or so-called gating of the clock obviously also stops data flow on the chip concerned along with related data transitions. Clock gating gets more difficult to implement the higher the operating frequencies.

The adiabatic energy recycling nature of rotary wave differential clocking/timing circuitry hereof allows a much more radical approach in which the inherently low power consuming clock can simply be allowed to stay running, say with data flow and/or logic results held by low power latch provisions, conveniently using choking on data lines.

Figure 26:
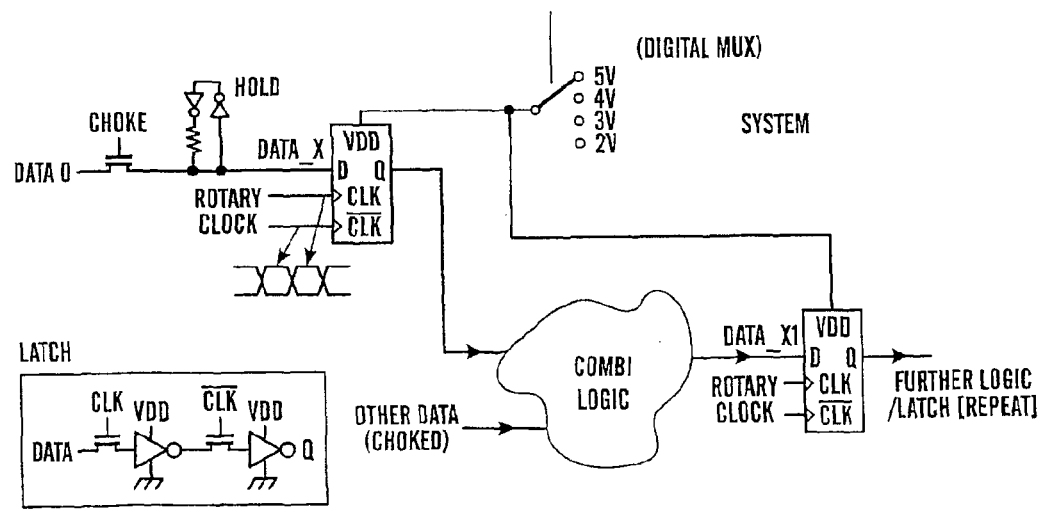
FIG. 26 concerns low power mode without stopping the clock/timing generation.

FIG. 26 indicates such provisions by way of latching of data lines exemplified by latch 125A shown associated with an exemplary one bit line DATA0 of a data bus along with choke and hold provisions shown by way of FET 126 in the line DATA0 with control by *CHOKE signal to its gate, and hold circuit 127 shown of standard inverters and resistor type to supply the D input of the latch 125A on line DATA 0. The state of the DATA 0 line will match that of the DATA0 line before the *CHOKE signal invokes power saving, including after such *CHOKE control signal appears. FIG. 26 also shows another latch 128 for each data line such as DATA-0 out of combinational logic 130 to hold a state corresponding to the last relevant logic circuit result.

Differential rotary timing/clock signals hereof are shown permanently applied to the latches 125, 128 and latch outputs will remain the same until after the *CHOKE control signal changes to indicate exit from the low power mode. Operating voltage control is indicated at 132, and can be adjusted downwards during the choked low power mode as there are no state transitions and high voltage gate performance is irrelevant. Capacitive clock loadings and the internal latch structure of simple pass gate type (see inset for example) will be effective.

Power saving or "idling" mode is achieved without clock gating, specifically at issue of *CHOKE active low state to prevent further transitions on the DATA-0 line having its state held by the hold circuit 127. The rotary clock lines stay active and frequency can stay the same or be adjusted if desired. The combinational logic 130 can continue to evaluate the same results as all input data is choked and fixed. The latches 125, 128 will be operative to supply the same state on each clock cycle/pulse.

The invention claimed is:

1. An apparatus comprising:
   a differential transmission line in a closed loop, the differential transmission line including a first conductive trace, a second conductive trace, and an odd number of one or more cross-overs, wherein each of the one or more cross-overs is configured to reverse the polarity of a wave propagating through the differential transmission line, wherein at least portions of conductor parts of at least one of the one or more cross-overs are arranged side-by-side such that differential mutual inductive coupling is increased relative to a right angle cross-over; and
   a plurality of regenerative devices electrically connected along a path of the differential transmission line, wherein the plurality of regenerative devices are configured to provide energy to the wave to compensate for losses associated with the differential transmission line.

2. The apparatus of claim 1, wherein each of the plurality of regenerative devices includes a first inverter and a second inverter, wherein the first inverter includes an input electrically connected to the first conductive trace and an output electrically connected to the second conductive trace, and wherein the second inverter includes an input electrically connected to the second conductive trace and an output electrically connected to the first conductive trace.

3. The apparatus of claim 2, wherein input and output connections of the first and second inverters are offset to control a direction of propagation of the wave.

4. The apparatus of claim 2, wherein the input of the second inverter is magnetically coupled to the first conductive trace and the input of the first inverter is magnetically coupled to the second conductive trace to reduce cross-conduction of the first and second inverters.

5. The apparatus of claim 1, further comprising an absorptive circuit configured to attenuate the wave when the wave propagates in a first direction so as to direct propagation of the wave in a second direction opposite the first direction.

6. The apparatus of claim 5, wherein the absorptive circuit comprises a diode configured to conduct when the wave propagates in the first direction.

7. The apparatus of claim 1, wherein the plurality of regenerative devices are configured to be sequentially powered up in a particular direction so as to control a direction of propagation of the wave.

8. The apparatus of claim 1, wherein the differential transmission line comprises a plurality of segments, wherein at least one of the segments is configured to be switchable in or out of the closed loop.

9. The apparatus of claim 1, wherein each of the plurality of regenerative devices includes a multiplexer, wherein the multiplexer includes a first input electrically connected to a first portion of the differential transmission line and a second input electrically connected to a second portion of the differential transmission line.

10. The apparatus of claim 1, wherein a portion of the first conductive trace in the cross-overs is configured as a clockwise spiral and a portion of the second conductor in the cross-overs is configured as a counterclockwise spiral.

11. The apparatus of claim 1, wherein the first conductive trace comprises a first plurality of conductive filaments and wherein the second conductive trace comprises a second plurality of conductive filaments.

12. The apparatus of claim 11, wherein the first plurality of conductive filaments is configured as a three-dimensional weave structure.

13. The apparatus of claim 11, further comprising a first plurality of capacitors electrically connected to the first plurality of conductive filaments and configured to balance a current density of the first plurality of conductive filaments.

14. The apparatus of claim 1, further comprising a dielectric interposed between at least a portion of the first and second conductive traces, wherein a thickness of the dielectric is configured to control a phase velocity of the wave.

15. The apparatus of claim 1, further comprising a ferrite covering disposed over the first and second conductive traces, wherein the ferrite covering is configured to control a phase velocity of the wave.

16. An apparatus comprising:
a differential transmission line in a closed loop, the differential transmission line including a first conductive trace, a second conductive trace, and an odd number of one or more cross-overs, wherein each of the one or more cross-overs is configured to reverse the polarity of a wave propagating through the differential transmission line, wherein at least portions of conductor parts of at least one of the one or more cross-overs are arranged side-by-side such that differential mutual inductive coupling is increased relative to a right angle cross-over; and
a means for regeneration electrically connected to the differential transmission line, wherein the regeneration means is configured to provide energy to the wave to compensate for losses associated with the differential transmission line.

17. The apparatus of claim 16, further comprising an absorptive circuit configured to attenuate the wave when the wave propagates in a first direction so as to direct propagation of the wave in a second direction opposite the first direction.

18. The apparatus of claim 16, further comprising a first plurality of capacitors, wherein the first conductive trace comprises a first plurality of conductive filaments, and wherein the first plurality of capacitors is electrically connected to the first plurality of conductive filaments and configured to balance a current density of the first plurality of conductive filaments.

19. The apparatus of claim 18, wherein the first plurality of conductive filaments is configured as a three-dimensional weave structure.

20. The apparatus of claim 16, wherein the differential transmission line comprises a plurality of segments, wherein at least one of the segments is configured to switchable in or out of the closed loop.

* * * * *